(12) United States Patent
Huang et al.

(10) Patent No.: US 11,362,170 B2
(45) Date of Patent: Jun. 14, 2022

(54) METAL-INSULATOR-METAL (MIM) CAPACITOR STRUCTURE AND METHOD FOR FORMING THE SAME

(71) Applicant: Taiwan Semiconductor Manufacturing Company, Ltd., Hsinchu (TW)

(72) Inventors: Chih-Fan Huang, Kaohsiung (TW); Chih-Yang Pai, Hsinchu (TW); Yuan-Yang Hsiao, Taipei (TW); Tsung-Chieh Hsiao, Shetou Township, Changhua County (TW); Hui-Chi Chen, Zhudong Township, Hsinchu County (TW); Dian-Hau Chen, Hsinchu (TW); Yen-Ming Chen, Chupei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/034,988

(22) Filed: Sep. 28, 2020

(65) Prior Publication Data

US 2021/0013301 A1 Jan. 14, 2021

Related U.S. Application Data

(63) Continuation of application No. 16/593,078, filed on Oct. 4, 2019, now Pat. No. 11,031,458, which is a
(Continued)

(51) Int. Cl.
*H01L 23/64* (2006.01)
*H01L 49/02* (2006.01)
(Continued)

(52) U.S. Cl.
CPC ............. *H01L 28/60* (2013.01); *H01G 4/012* (2013.01); *H01G 4/10* (2013.01); *H01G 4/33* (2013.01);
(Continued)

(58) Field of Classification Search
CPC ....... H01L 28/60; H01L 23/642; H01L 28/40; H01L 28/75; H01G 4/012; H01G 4/10; H01G 4/33; H01G 4/40
(Continued)

(56) References Cited

U.S. PATENT DOCUMENTS 5,851,868 A 12/1998 Kim
6,284,590 B1 9/2001 Cha et al.
(Continued)

FOREIGN PATENT DOCUMENTS

CN 105632897 A 6/2016
CN 205564739 U 9/2016
JP 2009-130207 A 6/2009

OTHER PUBLICATIONS

Final Office Action dated Nov. 25, 2020, issued in U.S. Appl. No. 16/593,078 (copy not provided).
(Continued)

*Primary Examiner* — David Vu
*Assistant Examiner* — Brandon C Fox
(74) *Attorney, Agent, or Firm* — McClure, Qualey & Rodack, LLP

(57) ABSTRACT

A metal-insulator-metal (MIM) capacitor structure and a method for forming the same are provided. The MIM capacitor structure includes a substrate, and the substrate includes a capacitor region and a non-capacitor region. The MIM capacitor structure includes a first electrode layer formed over the substrate, and a first spacer formed on a sidewall of the first electrode layer. The MIM capacitor
(Continued)

structure includes a second electrode layer formed over the first electrode layer, and a second spacer formed on a sidewall of the second electrode layer. The second spacer is in direct contact with an interface between the second electrode layer and a first dielectric layer.

20 Claims, 19 Drawing Sheets

Related U.S. Application Data continuation of application No. 15/794,139, filed on Oct. 26, 2017, now Pat. No. 10,468,478.

(51) Int. Cl.
  *H01G 4/33* (2006.01)
  *H01G 4/10* (2006.01)
  *H01G 4/012* (2006.01)
  *H01G 4/40* (2006.01)

(52) U.S. Cl.
  CPC ............. *H01G 4/40* (2013.01); *H01L 23/642* (2013.01); *H01L 28/40* (2013.01); *H01L 28/75* (2013.01)

(58) Field of Classification Search
  USPC .......................................... 257/532; 438/238
  See application file for complete search history.

(56) References Cited

U.S. PATENT DOCUMENTS

| | | |
|---|---|---|
| 8,125,049 B2 | 2/2012 | Coolbaugh |
| 8,237,208 B2 | 8/2012 | Iwaki |
| 9,257,498 B1 | 2/2016 | Hsu et al. |
| 9,391,016 B2 | 7/2016 | Shen et al. |
| 9,761,655 B1* | 9/2017 | Ando ................ H01L 21/76883 |
| 10,580,581 B2* | 3/2020 | Fox, III ................... H01G 4/33 |
| 10,615,112 B2 | 4/2020 | Li et al. |
| 2007/0057343 A1 | 3/2007 | Chinthakindi et al. |
| 2007/0085165 A1 | 4/2007 | Oh |
| 2009/0004809 A1 | 1/2009 | Chinthakindi |
| 2009/0134493 A1* | 5/2009 | Iwaki ...................... H01L 28/55 257/532 |
| 2013/0270675 A1* | 10/2013 | Childs ................. H01L 23/5226 257/532 |
| 2014/0159200 A1* | 6/2014 | Loke ................... H01L 23/5223 257/532 |
| 2016/0104762 A1* | 4/2016 | Triyoso ................... H01L 28/60 257/532 |
| 2019/0013269 A1 | 1/2019 | Zhang et al. |

OTHER PUBLICATIONS

Notice of Allowance dated Feb. 10, 2021, issued in U.S. Appl. No. 16/593,078 (copy not provided).
Chinese language office action dated Nov. 8, 2021, issued in application No. CN 201810211593.4.

* cited by examiner

METAL-INSULATOR-METAL (MIM) CAPACITOR STRUCTURE AND METHOD FOR FORMING THE SAME

CROSS REFERENCE TO RELATED APPLICATIONS

This application is a Continuation application of U.S. patent application Ser. No. 16/593,078, filed on Oct. 4, 2019 (now U.S. Pat. No. 11,031,458), which is a Continuation application of U.S. patent application Ser. No. 15/794,139, filed on Oct. 26, 2017 (now U.S. Pat. No. 10,468,478, issued on Nov. 5, 2019), the entire of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

One type of capacitor is a metal-insulator-metal (MIM) capacitor, which is used in mixed signal devices and logic devices, such as embedded memories and radio frequency devices. Metal-insulator-metal capacitors are used to store a charge in a variety of semiconductor devices. Although existing processes for manufacturing metal-insulator-metal capacitors have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
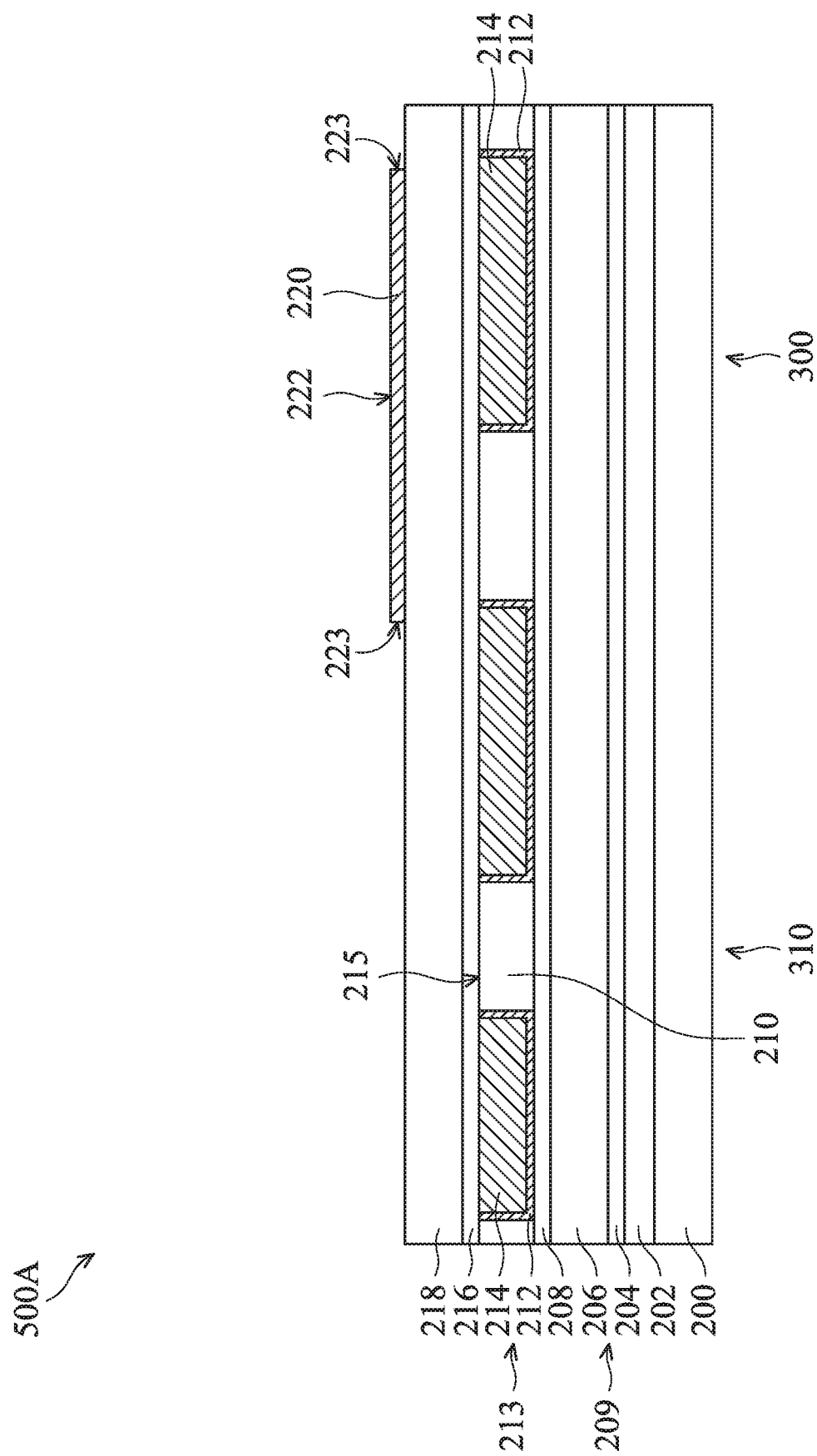
FIGS. 1A to 1K are cross-sectional views of various stages of a process for forming a metal-insulator-metal (MIM) capacitor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A to 1K are cross-sectional views of various stages of a process for forming a metal-insulator-metal (MIM) capacitor structure 500A, in accordance with some embodiments. As shown in FIG. 1A, a substrate 200 is received in accordance with some embodiments. The substrate 200 may include a capacitor region 300 and a non-capacitor region 310 adjacent to the capacitor region 300. The capacitor region 300 is configured to provide metal-insulator-metal (MIM) capacitors formed thereon by in a back-end-of-line (BEOL) process. In addition, and the non-capacitor region 310 is configured to provide device elements (not shown) formed thereon. For example, the device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, and/or other applicable elements. In some embodiments, the device elements are formed in the substrate 200 in a front-end-of-line (FEOL) process.

In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 200 may further include isolation features (not shown), such as shallow trench isolation (STI) features or local oxidation of silicon (LOCOS) features. Isolation features may surround and isolate various device elements.

As shown in FIG. 1A, an interconnect structure 209 is formed over the substrate 200. The interconnect structure 209 may include dielectric layers 202, 206 and 210, etch stop layers 204 and 208 and top metal lines 213. The dielectric layers 202, 206 and 210 and the etch stop layers 204 and 208 may be formed one over another in an alternating fashion. In addition, the interconnect structure 209 may include metal lines (not shown) and vias (not shown) formed embedded in the dielectric layers 202 and 206. Furthermore, the interconnect structure 209 may include top metal lines 213 formed in the dielectric layer 202 close to a top surface 215 of the interconnect structure 209. The interconnect structure 209 may be formed in the back-end-of-line (BEOL) process.

In some embodiments, the dielectric layers 202, 206 and 210 are made of undoped silicate glass (USG), fluorinated silicate glass (FSG), carbon-doped silicate glass, silicon oxide, silicon nitride or silicon oxynitride. In some embodiments, the dielectric layers 202, 206 and 210 are formed by a chemical vapor deposition (CVD) process, a spin-on process, a sputtering process, or a combination thereof.

In some embodiments, the etch stop layers 204 and 208 are made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material. In some embodiments, the etch stop layers 204 and 208 are formed by performing a plasma enhanced chemical vapor deposition (CVD) process, a low pressure CVD process, an atomic layer deposition (ALD) process, or another applicable process.

In some embodiments, the thickness of the dielectric layer 210 is greater than the thicknesses of the dielectric layers 202 and 206. For example, the thickness of the dielectric layer 202 is in a range from about 1500 Å to about 2500 Å (e.g. about 2000 Å), the thickness of the dielectric layer 206 is in a range from about 5000 Å to about 7000 Å (e.g. about 6200 Å), and the thickness of the dielectric layer 210 is in a range from about 8000 Å to about 10000 Å (e.g. about 9000 Å).

In some embodiments, each of the top metal lines 213 includes a barrier layer 212 and a metal material 214 over the barrier layer 212. The barrier layer 212 may be configured to separate the metal material 214 from the dielectric layer 210. For example, the barrier layer 212 may be made of titanium (Ti), titanium alloy, tantalum (Ta) or tantalum alloy. For example, the barrier layer 212 may be made of tantalum nitride (TaN). The metal material 214 may be made of a conductive material, such as copper (Cu), aluminum (Al), tungsten (W), or another applicable material. In some embodiments, the top metal lines 213 are formed by performing a deposition process (e.g. a physical vapor deposition (PVD) process, an atomic layer deposition (ALD) process, or another applicable process) and a subsequent planarization process (e.g. an etch-back process and/or a chemical mechanical polishing (CMP) process).

After the interconnect structure 209 is formed, an etch stop layer 216 and a dielectric layer 218 are formed over the interconnect structure 209 in sequence. Some materials and processes used to form the etch stop layer 216 may be similar to, or the same as, those used to form the first etch stop layers 204 and 208 and are not repeated herein. Some materials and processes used to form the dielectric layer 218 may be similar to, or the same as, those used to form the dielectric layers 202, 206 and 210 and are not repeated herein. In some embodiments, the thickness of the dielectric layer 218 is in a range from about 3000 Å to about 5000 Å, such as about 4000 Å.

Afterwards, a bottom electrode layer 220 is formed over the substrate 200, as shown in FIG. 1A in accordance with some embodiments. The bottom electrode layer 220 may be formed covering the dielectric layer 218 in the capacitor region 300 of the substrate 200. In other words, the bottom electrode layer 220 may be formed without covering the non-capacitor region 310 of the substrate 200. In addition, the bottom electrode layer 220 may overlap at least one of the top metal lines 213 (e.g. the rightmost one of the top metal lines 213) in the capacitor region 300 of the substrate 200.

In some embodiments, the bottom electrode layer 220 is made of metals. In some embodiments, the bottom electrode layer 220 is made of aluminum, copper, tungsten, titanium, tantalum, titanium nitride, tantalum nitride, or another applicable material. In some embodiments, the bottom electrode layer 220 is formed by performing a deposition process (e.g. a CVD process, a physical vapor deposition (PVD) process or an atomic layer deposition (ALD) process) and a subsequent patterning process (e.g. a photolithography process and a subsequent etching process).

Figure 1B:
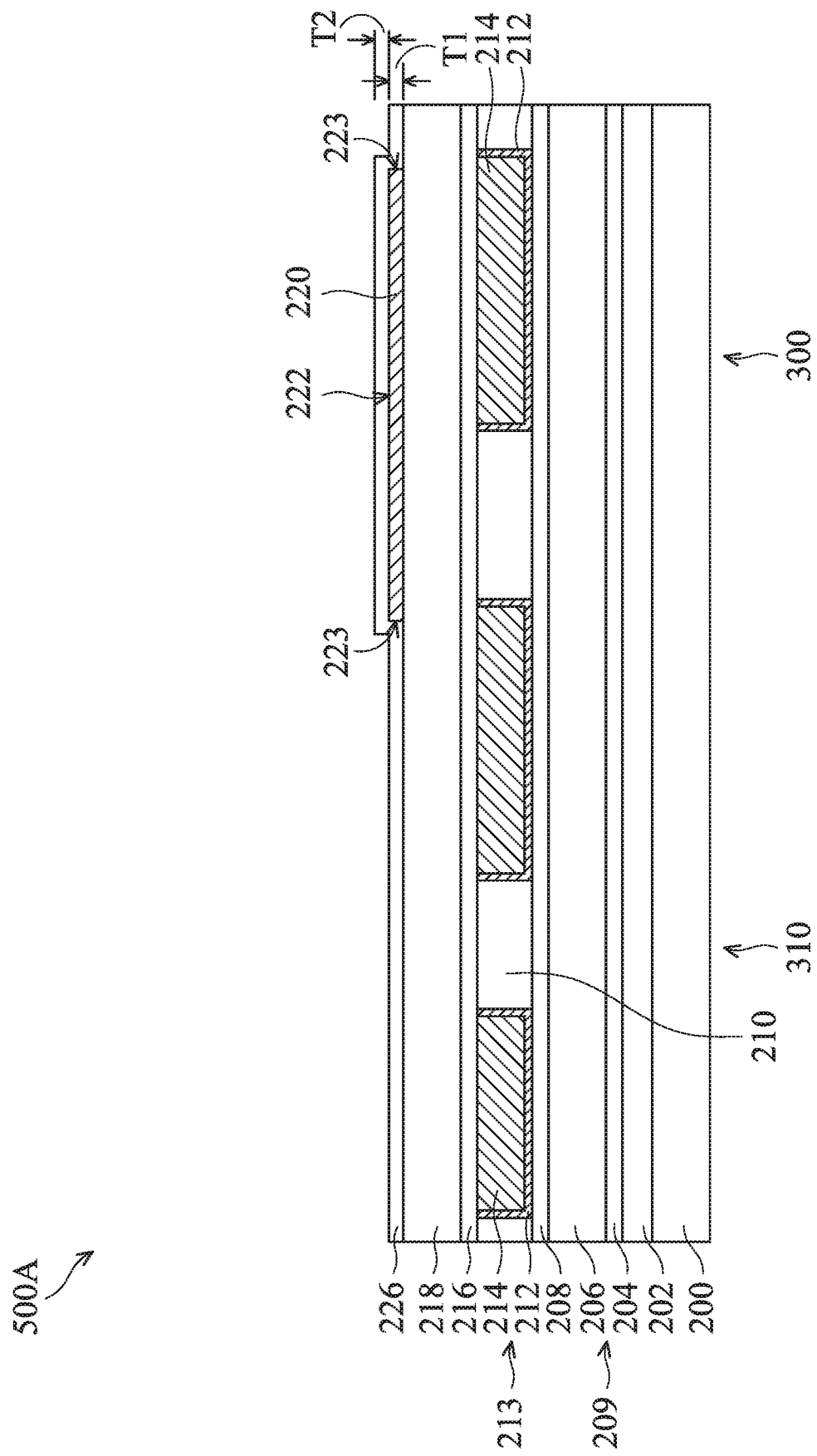

After the bottom electrode layer 220 is formed, a dielectric spacer layer 226 is formed over a top surface 222 and the opposite sidewalls 223 of the bottom electrode layer 220, as shown in FIG. 1B in accordance with some embodiments. The dielectric spacer layer 226 is conformally formed on the bottom electrode layer 220 and the dielectric layer 218 in the capacitor region 300 and the non-capacitor region 310 of the substrate 200.

In some embodiments, the dielectric spacer layer 226 includes a single layer structure or a multi-layer structure. The dielectric spacer layer 226 may be made of low dielectric constant (low-k) materials (e.g. k<5), such as silicon nitride (SiN), silicon oxide (SiO$_2$), silicon oxynitride (SiON), silicon carbide (SiC), silicon carbonitride (SiCN), another suitable material, or a combination thereof. The dielectric spacer layer 226 may be deposited using a chemical vapor deposition (CVD) process, a physical vapor deposition (PVD) process, a spin-on process, another applicable process, or a combination thereof. In some embodiments, the bottom electrode layer 220 has a thickness T1 and the dielectric spacer layer 226 has a thickness T2. For example, the thickness T1 of the bottom electrode layer 220 may be equal to the thickness T2 of the dielectric spacer layer 226.

Figure 1C:
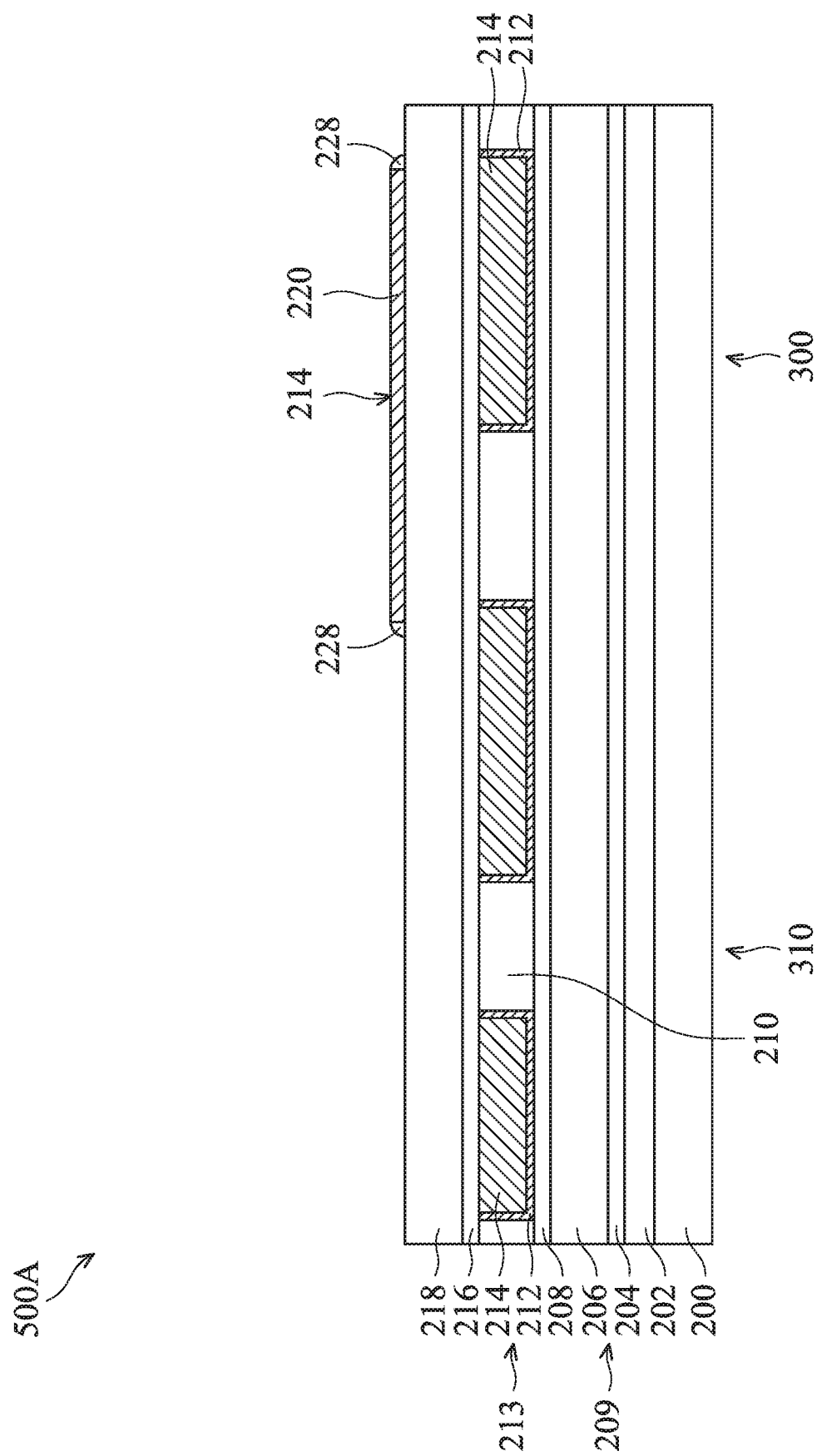

After the dielectric spacer layer 226 is formed, a portion of the dielectric spacer layer 226 over the top surface 222 of the bottom electrode layer 220 is removed to form dielectric spacers 228, as shown in FIG. 1C in accordance with some embodiments. The dielectric spacers 228 may be formed on the opposite sidewalls 223 of the bottom electrode layer 220 by an etching process (not shown). The dielectric spacers 228 may be formed extending over a portion of the dielectric layer 218 in the capacitor region 300 of the substrate 200. The dielectric spacers 228 may be sector-shaped in the cross-sectional view shown in FIG. 1C. In some embodiments, the dielectric spacers 228 are formed by an etching process including a dry etch process.

Figure 1D:
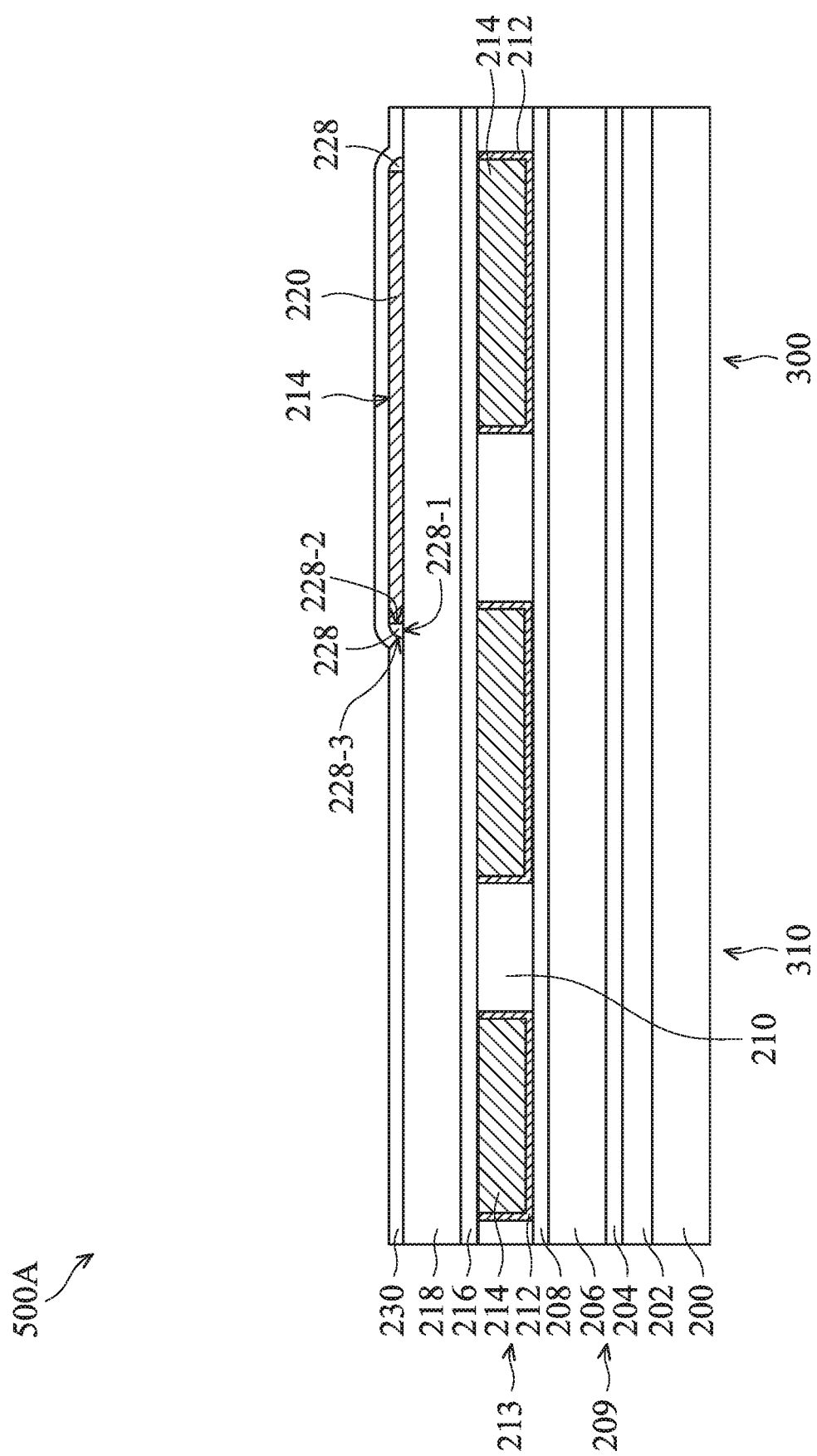

After the dielectric spacers 228 are formed, a dielectric layer 230 is formed over the bottom electrode layer 220, as shown in FIG. 1D in accordance with some embodiments.

The dielectric layer 230 may be conformally formed on the bottom electrode layer 220 and the dielectric spacers 228. The dielectric layer 230 may be formed extending over the dielectric layer 218 in the capacitor region 300 and the non-capacitor region 310 of the substrate 200. In some embodiments, each of the dielectric spacers 228 is in contact with the dielectric layer 218, the dielectric layer 230 and the bottom electrode layer 220. More specifically, the dielectric layer 218 is in contact with a surface 228-1 of each of the dielectric spacers 228, the bottom electrode layer 220 is in contact with a surface 228-2 of each of the dielectric spacers 228, the dielectric layer 230 is in contact with a surface 228-3 of each of the dielectric spacers 228.

In some embodiments, the dielectric layer 230 is made of a high dielectric constant (high-k) dielectric materials (e.g. the dielectric constant (k) is in a range from about 10 to about 20) including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or another applicable material. Therefore, the dielectric spacers 228 and the dielectric layer 230 are formed of different dielectric materials. The dielectric constant of the dielectric spacers 228 may be different from the dielectric constant of the dielectric layer 230. For example, the dielectric constant of the dielectric spacers 228 is lower than the dielectric constant of the dielectric layer 230. The difference between the dielectric constants of the dielectric spacers 228 and the dielectric layer 230 may be equal to or greater than 5.

In some embodiments, the dielectric layer 230 is formed by performing a plasma enhanced chemical vapor deposition (CVD) process, a low pressure CVD process, an atomic layer deposition (ALD) process, a molecular beam deposition (MBD) or another applicable process.

Figure 1E:
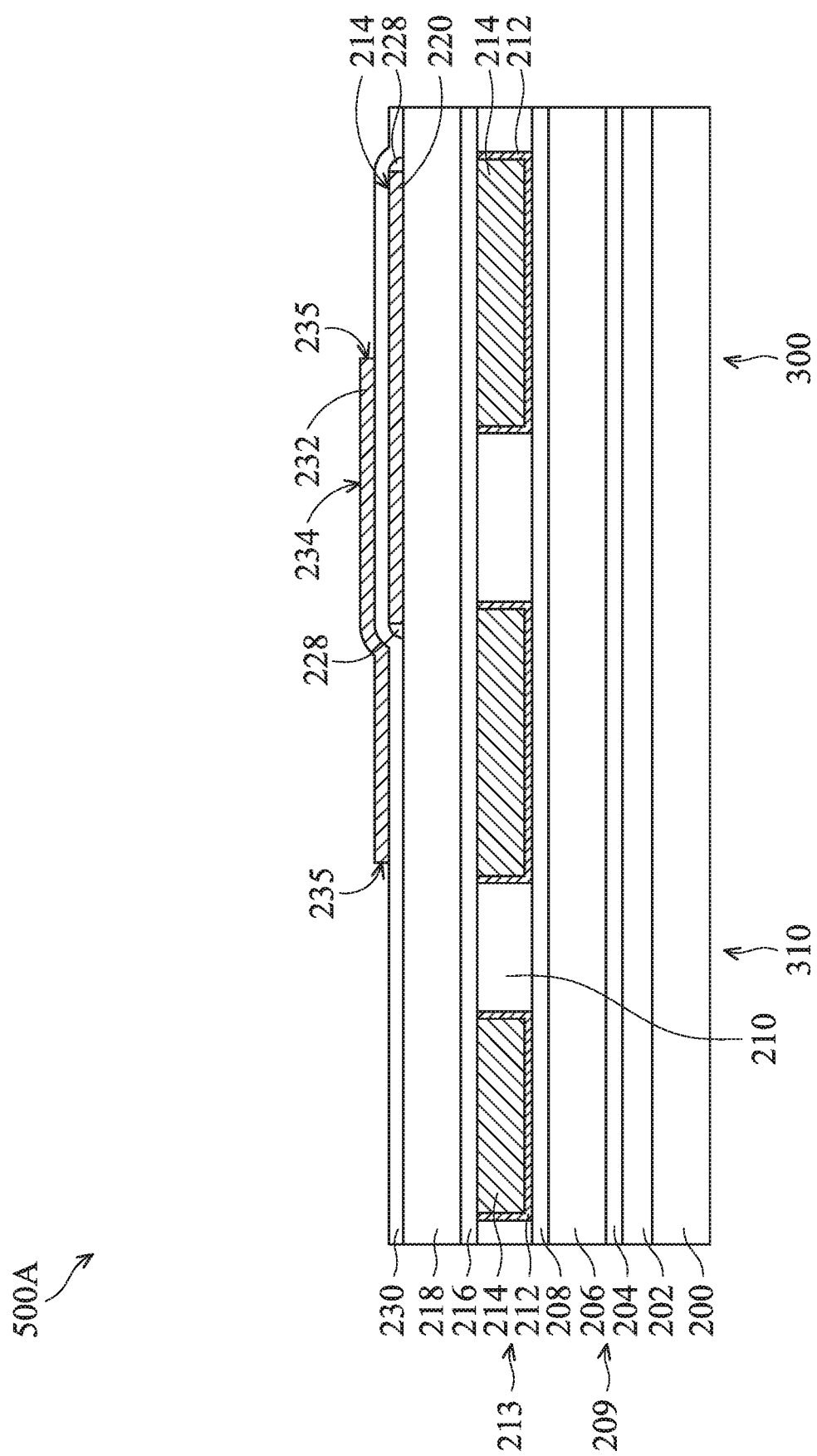

After the dielectric layer 230 is formed, a middle electrode layer 232 is formed over the dielectric layer 230, as shown in FIG. 1E in accordance with some embodiments. In some embodiments, the middle electrode layer 232 partially overlaps the bottom electrode layer 220. The dielectric layer 230 may be positioned between the bottom electrode layer 220 and the middle electrode layer 232. The sidewall 223 of the bottom electrode layer 220 may be separated from the middle electrode layer 232 by the dielectric layer 230 and the dielectric spacer 228. In addition, the middle electrode layer 232 may overlap at least one of the top metal lines 213 (e.g. the middle one of the top metal lines 213). The materials, configurations, structures and/or processes of the middle electrode layer 232 may be similar to, or the same as, those of the bottom electrode layer 220, and the details thereof are not repeated herein.

Figure 1F:
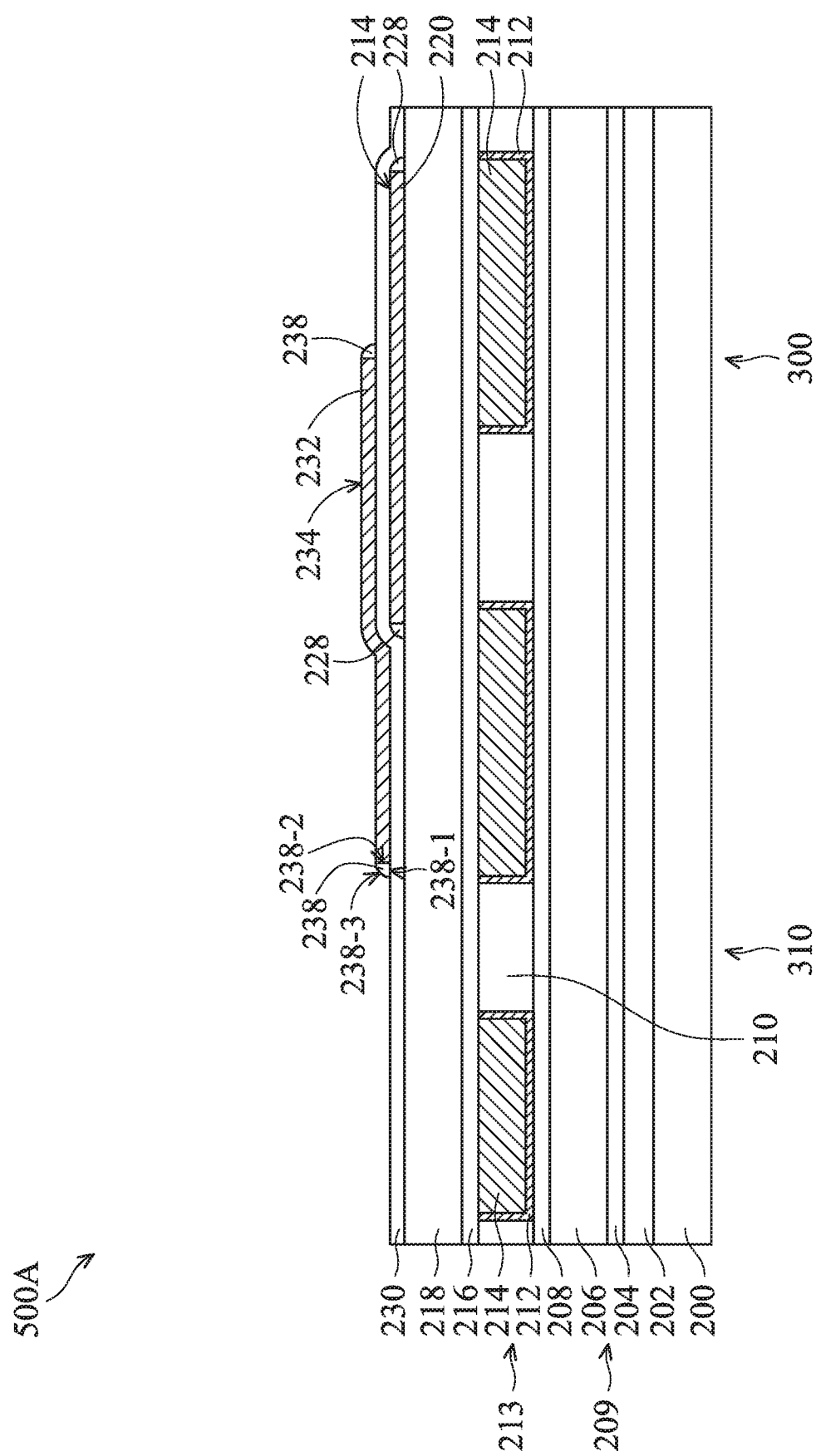

After the middle electrode layer 232 is formed, the dielectric spacers 238 are formed on opposite sidewalls 235 of the middle electrode layer 232, as shown in FIG. 1F in accordance with some embodiments. The dielectric spacers 238 may be formed extending over the dielectric layer 218 the dielectric layer 230 in the capacitor region 300 of the substrate 200. The materials, configurations, structures and/ or processes of the dielectric spacers 238 may be similar to, or the same as, those of the dielectric spacers 228, and the details thereof are not repeated herein.

Figure 1G:
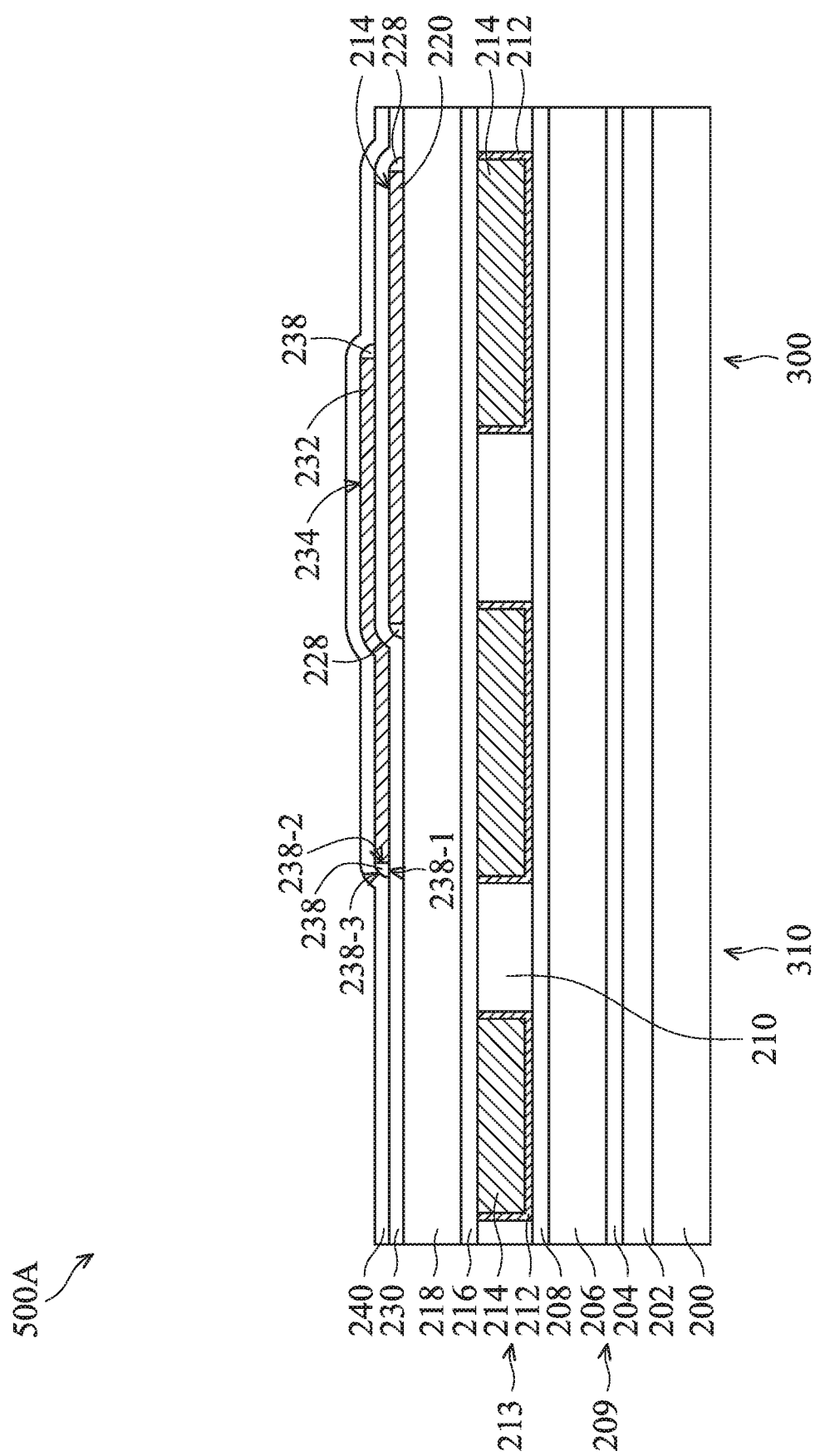

After the dielectric spacers 238 are formed, a dielectric layer 240 is formed over the middle electrode layer 232, as shown in FIG. 1G in accordance with some embodiments. The dielectric layer 240 may be conformally formed on the bottom electrode layer 220, the dielectric spacers 228, the middle electrode layer 232 and the dielectric spacers 238. The dielectric layer 230 may be formed extending over the dielectric layer 218 in the capacitor region 300 and the non-capacitor region 310 of the substrate 200.

In some embodiments, each of the dielectric spacers 238 is in contact with the dielectric layer 230, the dielectric layer 240 and the middle electrode layer 232. More specifically, the dielectric layer 230 is in contact with a surface 238-1 of each of the dielectric spacers 238, the middle electrode layer 232 is in contact with a surface 238-2 of each of the dielectric spacers 238, the dielectric layer 240 is in contact with a surface 238-3 of each of the dielectric spacers 238.

Figure 1H:
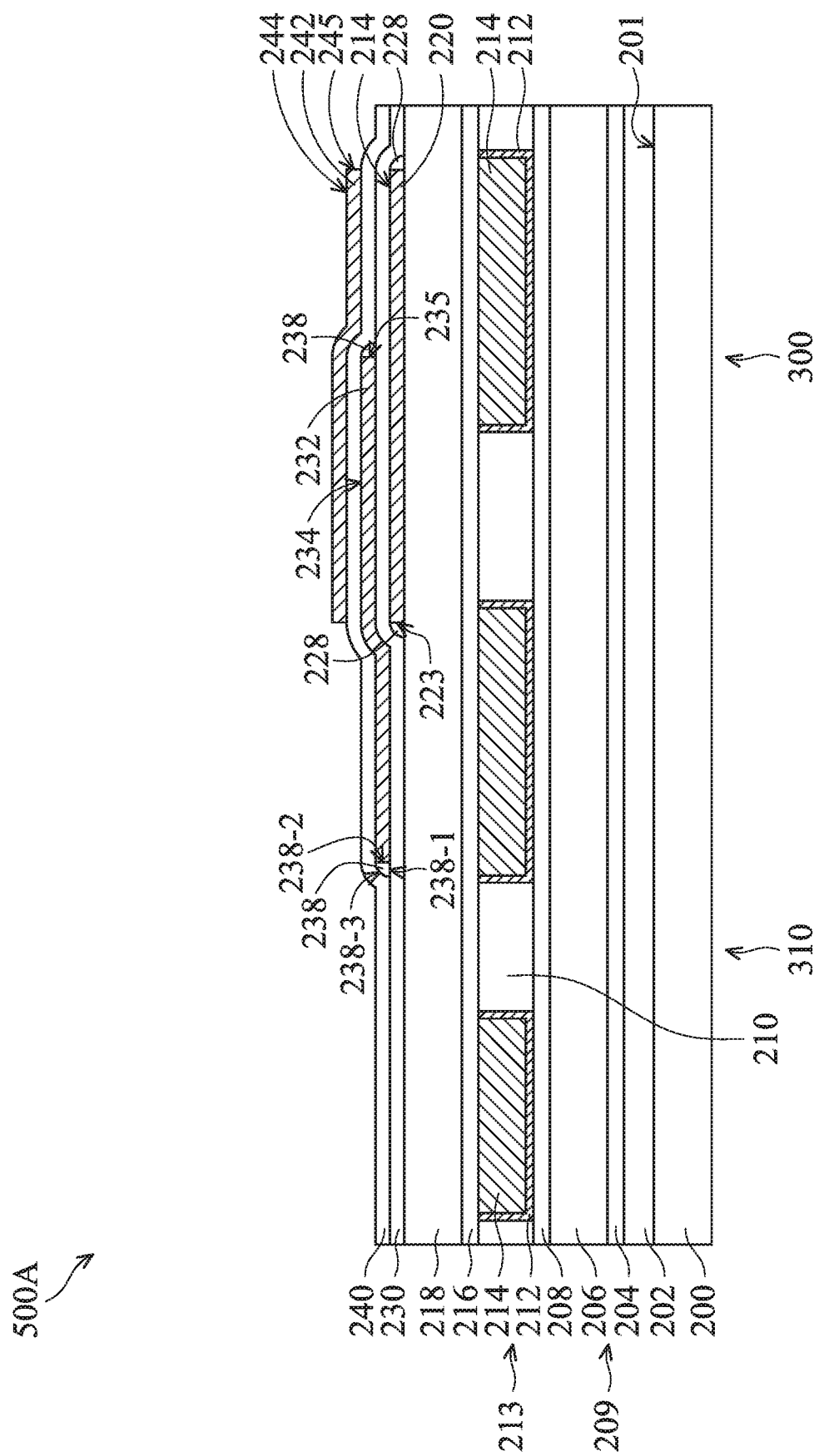

After the dielectric layer 240 is formed, a top electrode layer 242 is formed over the dielectric layer 240, as shown in FIG. 1H in accordance with some embodiments. In some embodiments, the top electrode layer 242 partially overlaps the middle electrode layer 232. The top electrode layer 242 may fully overlap the bottom electrode layer 220. Therefore, sidewalls 245 of the top electrode layer 242 may be aligned with the corresponding sidewalls 223 of the bottom electrode layer 220. In other words, the bottom electrode layer 220, the middle electrode layer 232 and the top electrode layer 242 may substantially be arranged in a staggered arrangement along the normal line of a top surface 201 of the substrate 200. In addition, the top electrode layer 242 may overlap at least one of the top metal lines 213 (e.g. the rightmost one of the top metal lines 213).

As shown in FIG. 1H, the dielectric layer 240 may be positioned between the middle electrode layer 232 and the top electrode layer 242. The sidewalls 223 of the bottom electrode layer 220 may be separated from the top electrode layer 242 by the dielectric layer 230, the dielectric layer 240 and the dielectric spacers 228. The sidewall 235 of the middle electrode layer 232 may be separated from the top electrode layer 242 by the dielectric layer 240 and the dielectric spacer 238. In some embodiments, there are no dielectric spacers formed on sidewalls 245 of the top electrode layer 242.

The materials, configurations, structures and/or processes of the top electrode layer 242 may be similar to, or the same as, those of the bottom electrode layer 220 and the middle electrode layer 232, and the details thereof are not repeated herein.

Figure 1I:
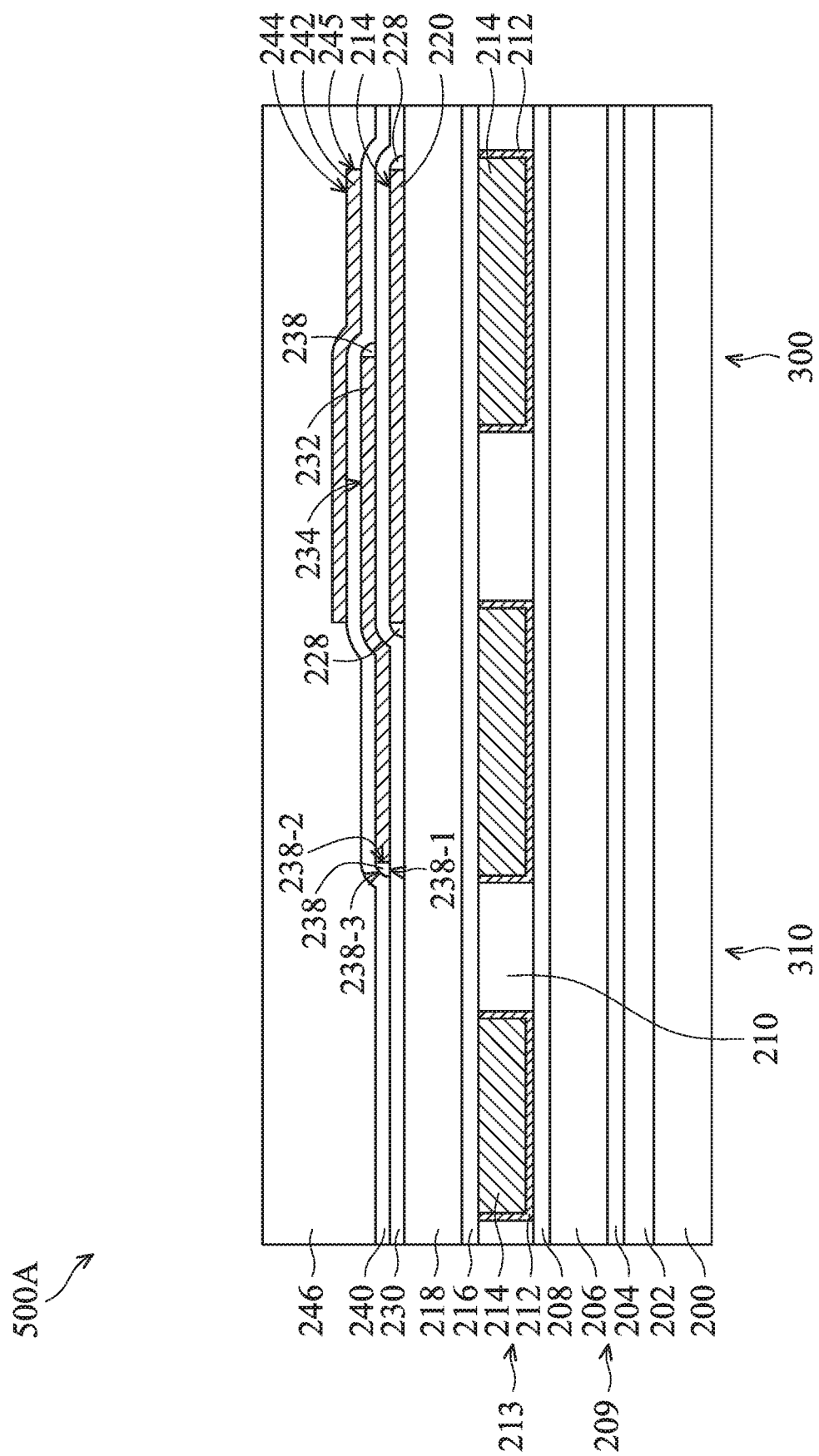

After the top electrode layer 242 is formed, a dielectric layer 246 is formed covering the bottom electrode layer 220, the middle electrode layer 232, the top electrode layer 242, the dielectric layer 230 the dielectric layer 240, the dielectric spacers 228 and the dielectric spacers 238, as shown in FIG. 1I in accordance with some embodiments. In some embodiments, the dielectric constant of the dielectric layer 246 is similar to or the same as the dielectric constant of the dielectric layer 218. Therefore, the dielectric constant of the dielectric layer 246 may be lower than the dielectric constants of the high-k dielectric layers 230 and 240 and the low-k dielectric spacers 228 and 238.

The materials, configurations, structures and/or processes of the dielectric layer 246 may be similar to, or the same as, those of the dielectric layer 218, and the details thereof are not repeated herein. In some embodiments, the thickness of the dielectric layer 246 is greater than or equal to the thicknesses of the dielectric layer 218. For example, the thickness of the dielectric layer 218 is in a range from about 3000 Å to about 5000 Å, and the thickness of the dielectric layer 246 is in a range from about 3500 Å to about 5500 Å. For example, the thickness of the dielectric layer 218 is about 4000 Å, and the thickness of the dielectric layer 246 is about 4500 Å.

Figure 1J:
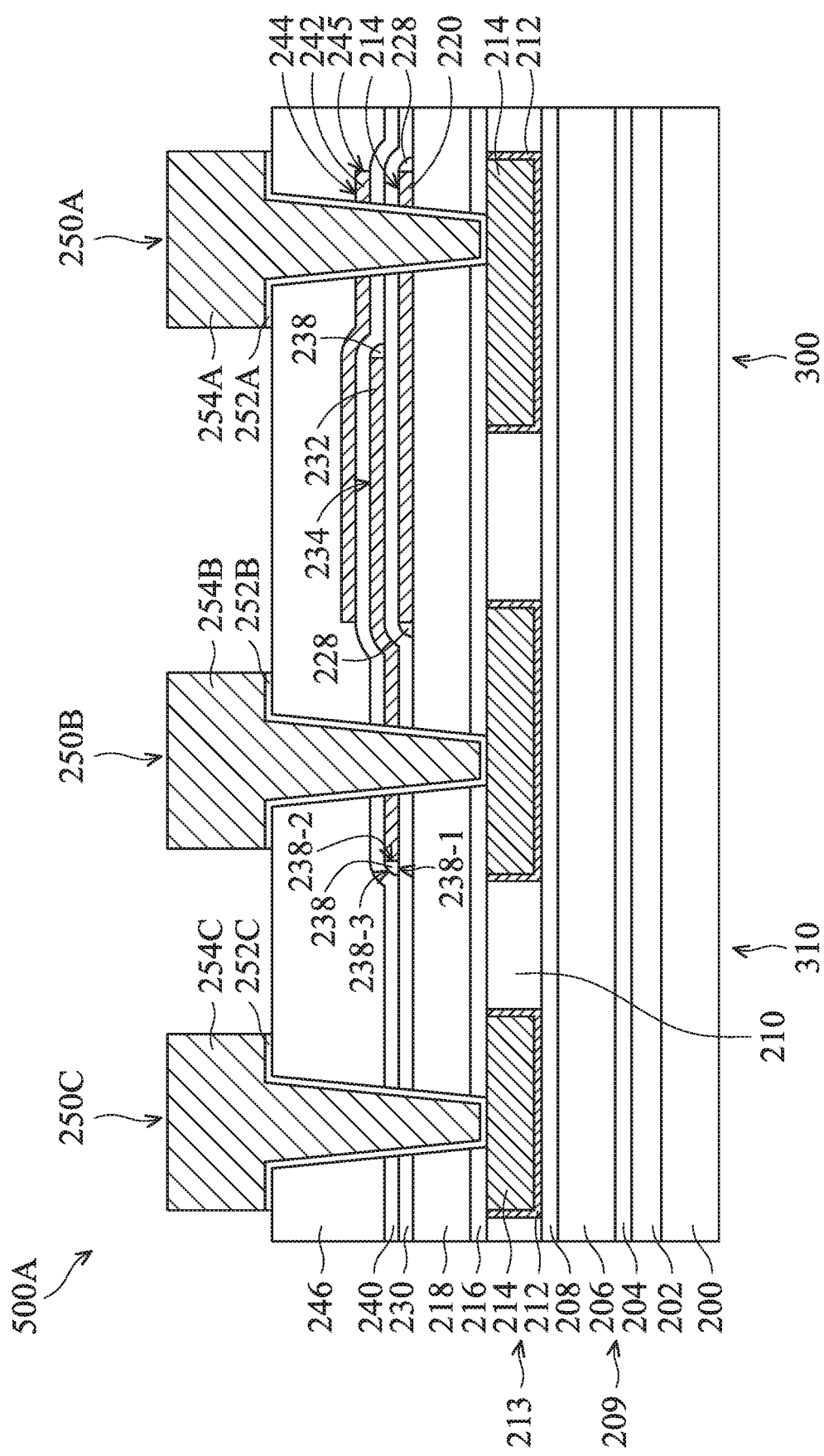

After the dielectric layer 246 is formed, redistribution layer (RDL) structures 250A, 250B and 250C are formed on the dielectric layer 246, as shown in FIG. 1J in accordance with some embodiments. The RDL structures 250A, 250B and 250C are formed passing through through the dielectric layers 218 and 246 and the etch stop layer 216. In addition, the RDL structures 250A, 250B and 250C are in contact with the corresponding top metal lines 213. More specifically, the RDL structure 250A may be formed passing through the bottom electrode layer 220, the top electrode layer 242, the dielectric layer 230 the dielectric layer 240 and electrically connected to the rightmost top metal line 213 in the capacitor region 300 of the substrate 200, as shown in FIG. 1J. The RDL structure 250B may be formed passing through the middle electrode layer 232, the dielectric layer 230 the dielectric layer 240 and electrically connected to the middle top metal line 213 in the capacitor region 300 of the substrate 200, as shown in FIG. 1J. Therefore, the RDL structure 250A is electrically connected to the bottom electrode layer 220 and the top electrode layer 242 of the resulting MIM capacitor structure 500A. The RDL structure 250B is electrically connected to the middle electrode layer 232 of the resulting MIM capacitor structure 500A. In addition, the RDL structure 250C may be formed passing through the dielectric layer 230 the dielectric layer 240 in the non-capacitor region 310 of the substrate 200, as shown in FIG. 1J.

In some embodiments, portions of the RDL structures 250A, 250B and 250C passing through the dielectric layers 218 and 246 and the etch stop layer 216 serve as via portions of the RDL structures 250A, 250B and 250C. In addition, portions of the RDL structures 250A, 250B and 250C above the dielectric layer 246 may serve as RDL portions of the RDL structures 250A, 250B and 250C.

In some embodiments, the RDL structure 250A includes a barrier layer 252A and a metal material 254A over the barrier layer 252A. Similarly, the RDL structure 250B may include a barrier layer 252B and a metal material 254B over the barrier layer 252B. The RDL structure 250C may include a barrier layer 252C and a metal material 254C over the barrier layer 252C. The materials, configurations, structures and/or processes of the barrier layers 252A, 252B and 252C may be similar to, or the same as, those of the barrier layer 212, and the details thereof are not repeated herein. The materials, configurations, structures and/or processes of the metal materials 254A, 254B and 254C may be similar to, or the same as, those of the metal material 214, and the details thereof are not repeated herein.

Figure 1K:
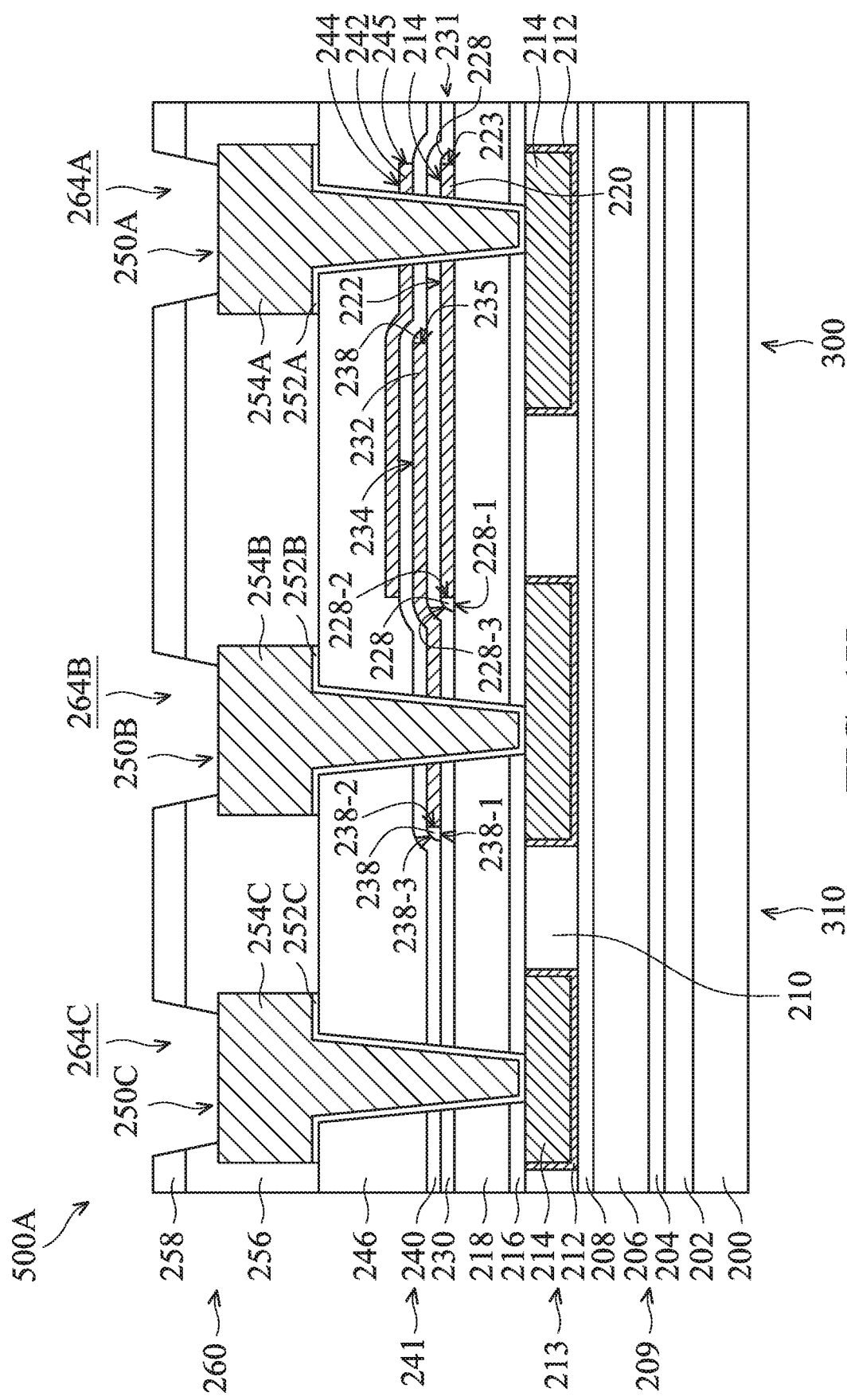

After the RDL structures 250A, 250B and 250C are formed, a passivation layer structure 260 is formed over the RDL structures 250A, 250B and 250C, as shown in FIG. 1K in accordance with some embodiments. In some embodiments, the passivation layer structure 260 includes a first passivation layer 256 and a second passivation layer 258 on the first passivation layer 256. In addition, the passivation layer structure 260 may have openings 264A, 264B and 264C respectively on the RDL structures 250A, 250B and 250C. Therefore, portions of the RDL structures 250A, 250B and 250C are respectively exposed from the openings 264A, 264B and 264C. The exposed portions of the RDL structures 250A, 250B and 250C may serve as pad portions of the resulting MIM capacitor structure 500A.

In some embodiments, the first passivation layer 256 and the second passivation layer 258 of the passivation layer structure 260 are formed of different dielectric materials. For example, the first passivation layer 256 may be formed of undoped silicate glass (USG), and the layer may be formed of silicon nitride (SiN). The passivation layer structure 260 may be formed by a deposition process (e.g. a CVD process, a spin-on process, a sputtering process, or a combination thereof) and a subsequent patterning process (e.g. a photolithography process and a subsequent etching process). In some embodiments, the thickness of the first passivation layer 256 is greater than the thickness of the second passivation layer 258. For example, the thickness of the first passivation layer 256 is in a range from about 10000 Å to about 14000 Å (e.g. about 12000 Å), and the thickness of the second passivation layer 258 is in a range from about 6000 Å to about 8000 Å (e.g. about 7000 Å).

After the aforementioned processes are performed, a metal-insulator-metal (MIM) capacitor structure 500A is formed, as shown in FIG. 1K in accordance with some embodiments.

In the MIM capacitor structure 500A, the dielectric spacer 228 and the dielectric layer 230 covering the dielectric spacer 228 may collectively serve as a dielectric composite structure 231 between the bottom electrode layer 220 and the middle electrode layer 232. The dielectric layer 230 may serve as a first portion of the dielectric composite structure 231 having a first dielectric constant. Each of the dielectric spacers 228 may serve as a second portion of the dielectric composite structure 231 having a second dielectric constant that is lower than the first dielectric constant. In addition, the dielectric constant of the dielectric layer 246 is lower than the dielectric constants of the first portion (i.e. the dielectric layer 230) and the second portion (i.e. the dielectric spacer 228) of the dielectric composite structure 231.

In the MIM capacitor structure 500A, the top surface 222 of the bottom electrode layer 220 is separated from the middle electrode layer 232 by the first portion (i.e. the dielectric layer 230) of the dielectric composite structure 231. The sidewall 223 of the bottom electrode layer 220 is separated from the middle electrode layer 232 by the second portion (i.e. the dielectric spacer 228) of the dielectric composite structure 231.

In the MIM capacitor structure 500A, the first portion (i.e. the dielectric layer 230) of the dielectric composite structure 231 and the bottom electrode layer 220 are in contact with different surfaces 228-2 and 228-3 of the second portion (i.e. the dielectric spacer 228) of the dielectric composite structure 231.

In the MIM capacitor structure 500A, the dielectric spacer 238 and the dielectric layer 240 covering the dielectric spacer 238 may collectively serve as a dielectric composite structure 241 between the middle electrode layer 232 and the top electrode layer 242. The dielectric layer 240 may serve as a third portion of the dielectric composite structure 241 having the first dielectric constant. Each of the dielectric spacer 238 may serve as a fourth portion of the dielectric composite structure 241 having the second dielectric constant that is lower than the first dielectric constant.

In the MIM capacitor structure 500A, the top surface 234 of the middle electrode layer 232 is separated from the top electrode layer 242 by the third portion (i.e. the dielectric layer 240) of the dielectric composite structure 241. The sidewall 235 of the middle electrode layer 232 is separated from the top electrode layer 242 by the fourth portion (i.e. the dielectric spacer 238) of the dielectric composite structure 241.

In the MIM capacitor structure 500A, the third portion (i.e. the dielectric layer 240) of the dielectric composite structure 241 and the middle electrode layer 232 are in contact with the different surfaces 238-2 and 238-3 of the fourth portion (i.e. the dielectric spacer 238) of the dielectric composite structure 241.

In some embodiments, the MIM capacitor structure 500A uses the low-k (e.g. k<5) dielectric spacers (e.g. the dielectric spacers 228 and 238) formed on the sidewalls 223 of the bottom electrode layer 220 and the sidewalls 235 of the middle electrode layer 232 partially overlapping the underlying bottom electrode layer 220. The dielectric spacers are sector-shaped in the cross-sectional view shown in FIG. 1K. Therefore, the top surface of the bottom/middle electrode layer and the outer sidewall (e.g. the surfaces 228-3 and 238-3) of the corresponding dielectric spacers may form a rounded corner for the high-k (e.g. 10≤k≤20) dielectric layer (e.g. the dielectric layers 230 and 240) directly formed thereon. The sector-shaped dielectric spacers may enlarge the distance between the sidewalls of the bottom/middle electrode layer and the corresponding high-k dielectric layer. In addition, the dielectric spacers can prevent a charge from concentrating in the high-k dielectric layer at the (sharp) corner between the top surface and the sidewall of the corresponding bottom/middle electrode layer. The portion of the high-k dielectric layer close to the corner of the underlying bottom/middle electrode layer may have an improved film quality. Therefore, the reliability problem of the MIM capacitor structure resulting from the charge that accumulates in the corner of the bottom/middle electrode layer can be avoided. Therefore, the MIM capacitor structure may have high capacitance value by thinning down the high-k dielectric layer without lowering the breakdown voltage of the MIM capacitor structure. The leakage problem of the MIM capacitor structure can also be eliminated.

FIGS. 2A to 2H are cross-sectional views of various stages of a process for forming a metal-insulator-metal (MIM) capacitor structure 500B, in accordance with some embodiments. The materials, configurations, structures and/or processes employed in FIGS. 1A to 1K may be utilized in the following embodiment and the details thereof may be omitted.

Figure 2A:
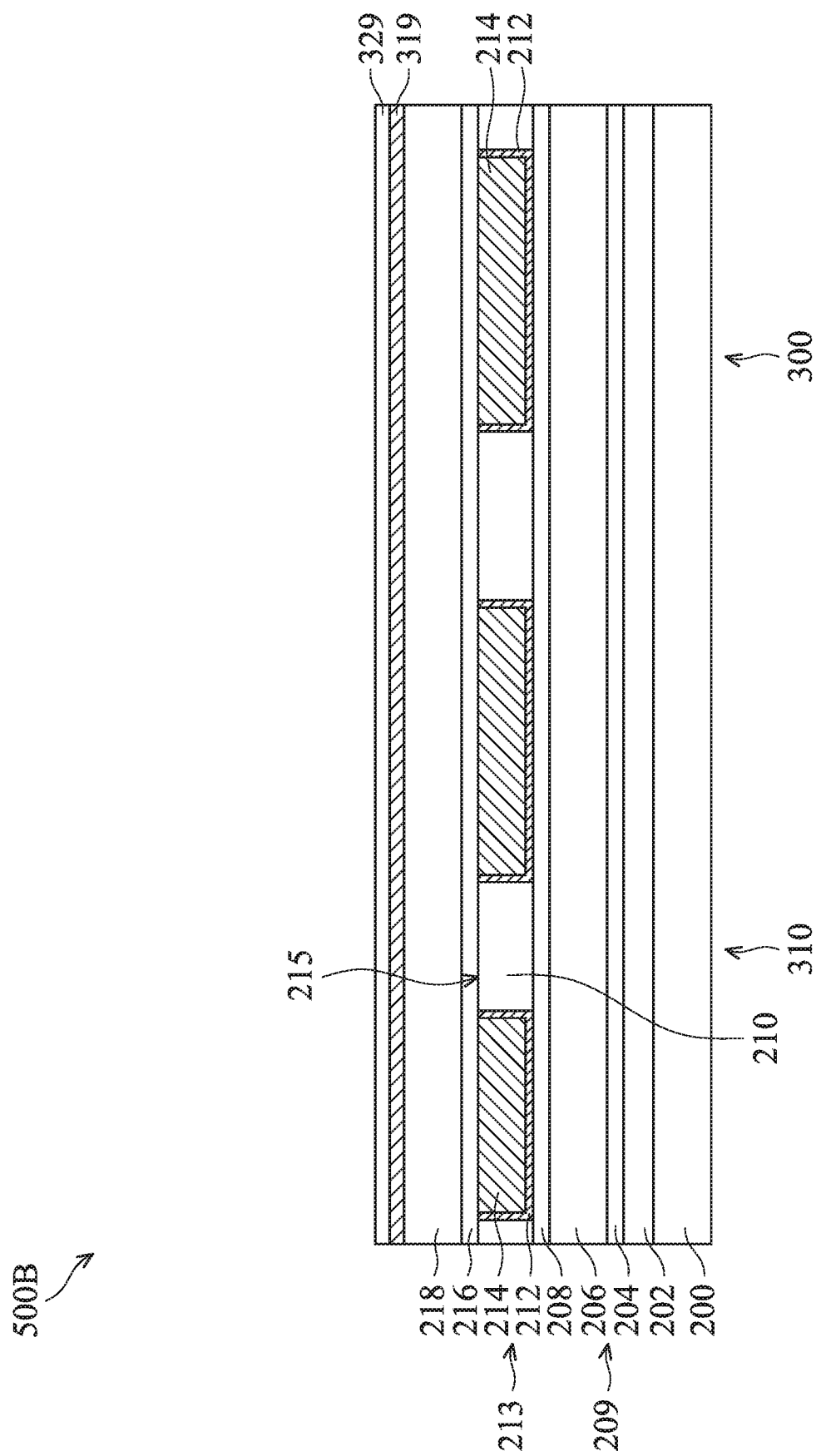
FIGS. 2A to 2H are cross-sectional views of various stages of a process for forming a metal-insulator-metal (MIM) capacitor structure, in accordance with some embodiments.

After the interconnect structure 209, the etch stop layer 216 and the dielectric layer 218 are formed over the substrate 200, a bottom electrode layer 319 and a dielectric layer 329 are formed over the dielectric layer 218 in sequence, as shown in FIG. 2A in accordance with some embodiments. The materials, configurations and/or structures of the bottom electrode layer 319 may be similar to, or the same as, those of the bottom electrode layer 220, and the details thereof are not repeated herein. The position, materials, configurations, structures and/or processes of the dielectric layer 329 may be similar to, or the same as, those of the dielectric layer 230, and the details thereof are not repeated herein.

Figure 2B:
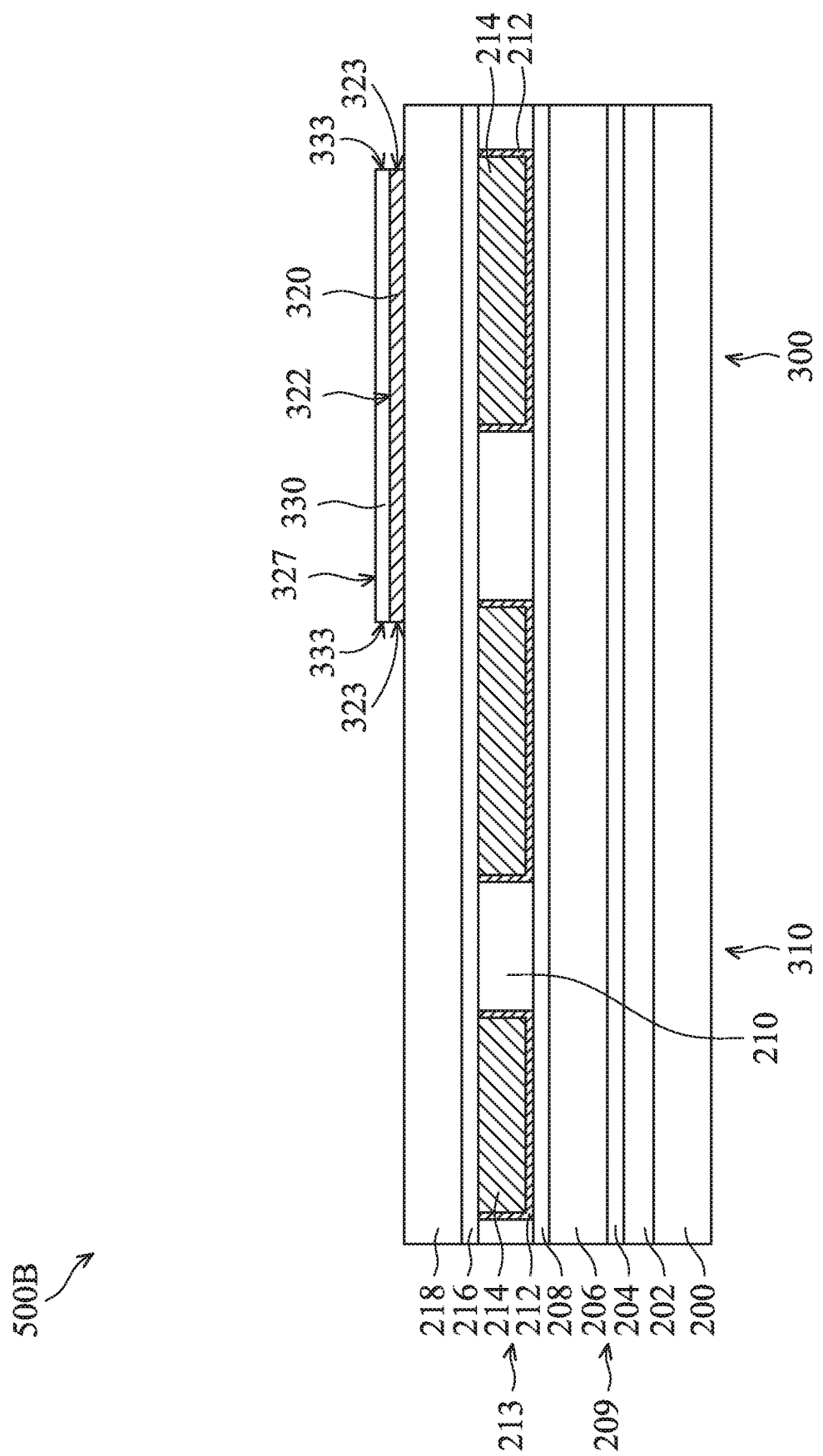

Afterwards, the bottom electrode layer 319 and the dielectric layer 329 in the non-capacitor region 310 are removed in a single patterning process to form a bottom electrode layer 320 and a dielectric layer 330, as shown in FIG. 2B in accordance with some embodiments. The position of the bottom electrode layer 320 may be similar to, or the same as, those of the bottom electrode layer 220. In some embodiments, opposite sidewalls 333 of the dielectric layer 330 are respectively aligned with corresponding opposite sidewalls 323 of the bottom electrode layer 320. In addition, the dielectric layer 330 is formed covering the capacitor region 300 without extending to cover the non-capacitor region 310 of the substrate 200. The patterning process may include a photolithography process and a subsequent etching process (e.g. a dry etching process).

Figure 2C:
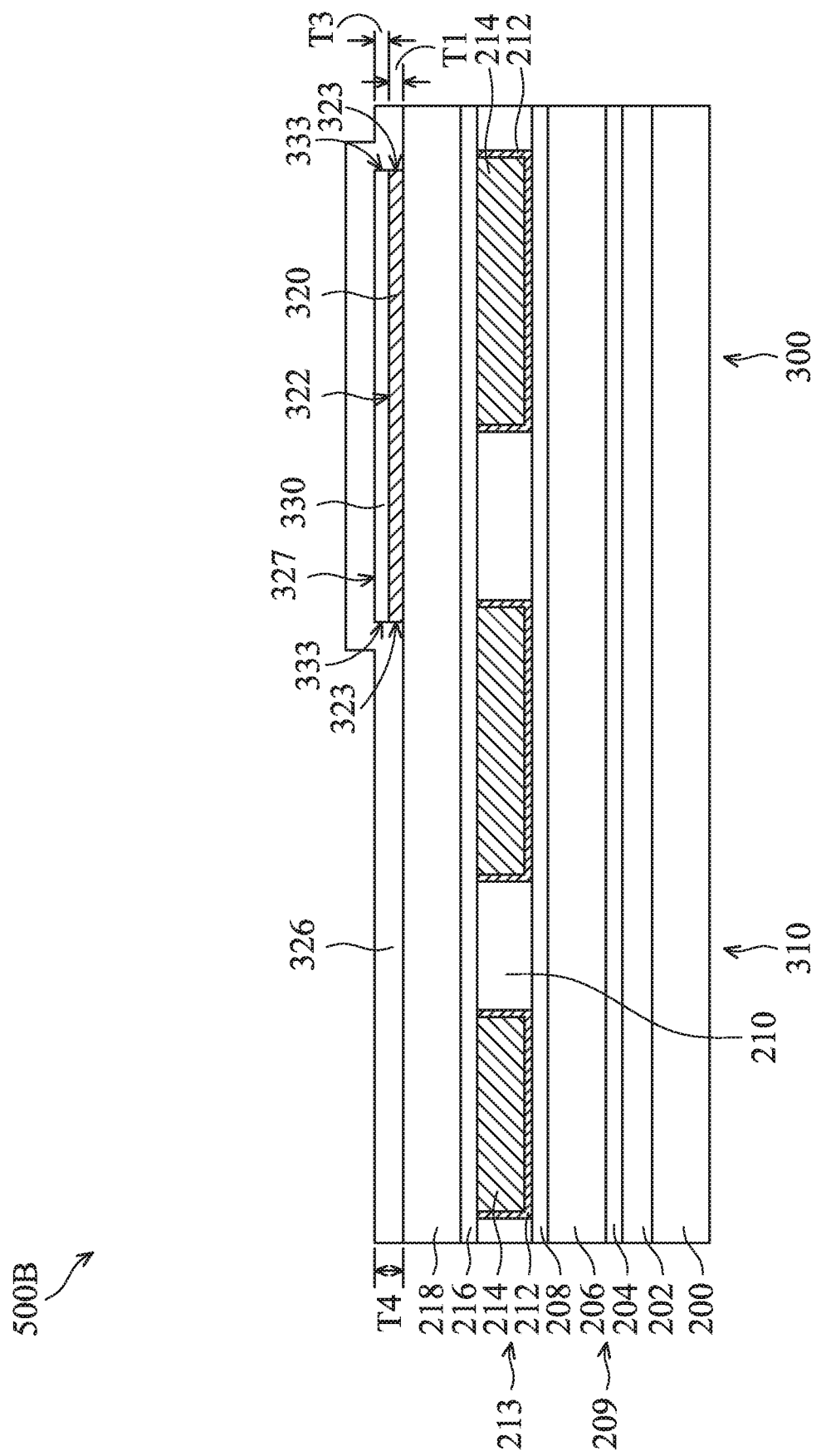

Afterwards, a dielectric spacer layer 326 is formed over a top surface 327 and the opposite sidewalls 333 of the dielectric layer 330, a top surface 322 and the opposite sidewalls 323 of the bottom electrode layer 320, as shown in FIG. 2C in accordance with some embodiments. The position, materials, configurations, structures and/or processes of the dielectric spacer layer 326 may be similar to, or the same as, those of the dielectric layer 226, and the details thereof are not repeated herein.

In some embodiments, the bottom electrode layer 320 has a thickness T1, the dielectric layer 330 has a thickness T3 and the dielectric spacer layer 326 has a thickness T4. For example, the thickness T1 of the bottom electrode layer 320 may be equal to the thickness T3 of the dielectric layer 330. In addition, the thickness T4 of the dielectric spacer layer 326 may be equal to the total thickness of the bottom electrode layer 320 and the dielectric layer 330 (i.e. T4=T1+T3).

Figure 2D:
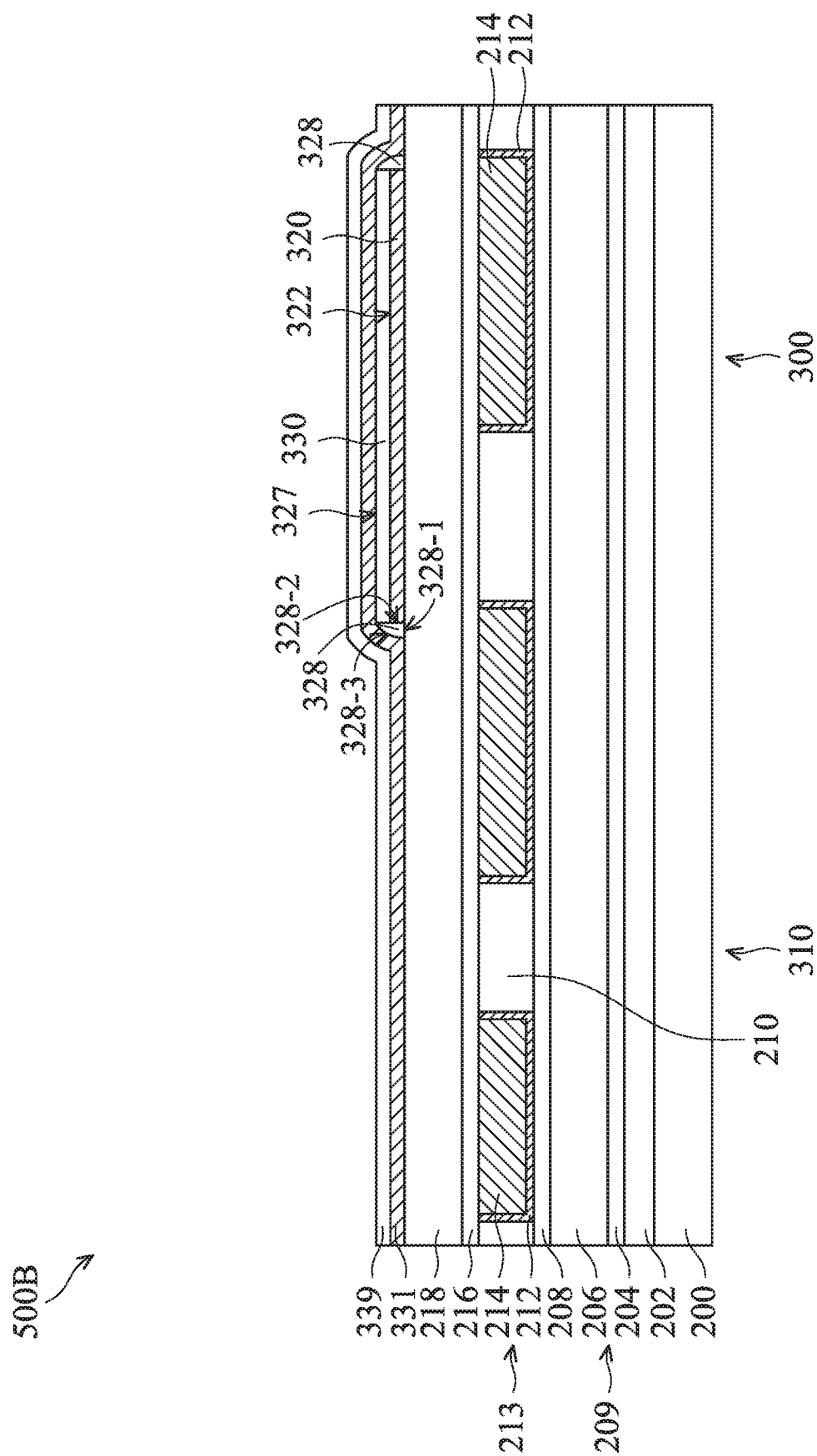

Afterwards, a portion of the dielectric spacer layer 326 the top surface 327 of the dielectric layer 330 (and over the top surface 322 of the bottom electrode layer 320) is removed to form dielectric spacers 328, as shown in FIG. 2D in accordance with some embodiments. The dielectric spacers 328 are formed on the opposite sidewalls 323 of the bottom electrode layer 320 and the opposite sidewalls 333 of the dielectric layer 330. The materials, configurations, structures and/or processes of the dielectric spacers 328 may be similar to, or the same as, those of the dielectric spacers 228, and the details thereof are not repeated herein.

Afterwards, a middle electrode layer 331 and a dielectric layer 339 are formed over the dielectric layers 218 and 330 in sequence, as shown in FIG. 2D in accordance with some embodiments. The materials, configurations and/or structures of the middle electrode layer 331 may be similar to, or the same as, those of the bottom electrode layer 320, and the details thereof are not repeated herein. The position, materials, configurations, structures and/or processes of the dielectric layer 339 may be similar to, or the same as, those of the dielectric layer 240, and the details thereof are not repeated herein.

Figure 2E:
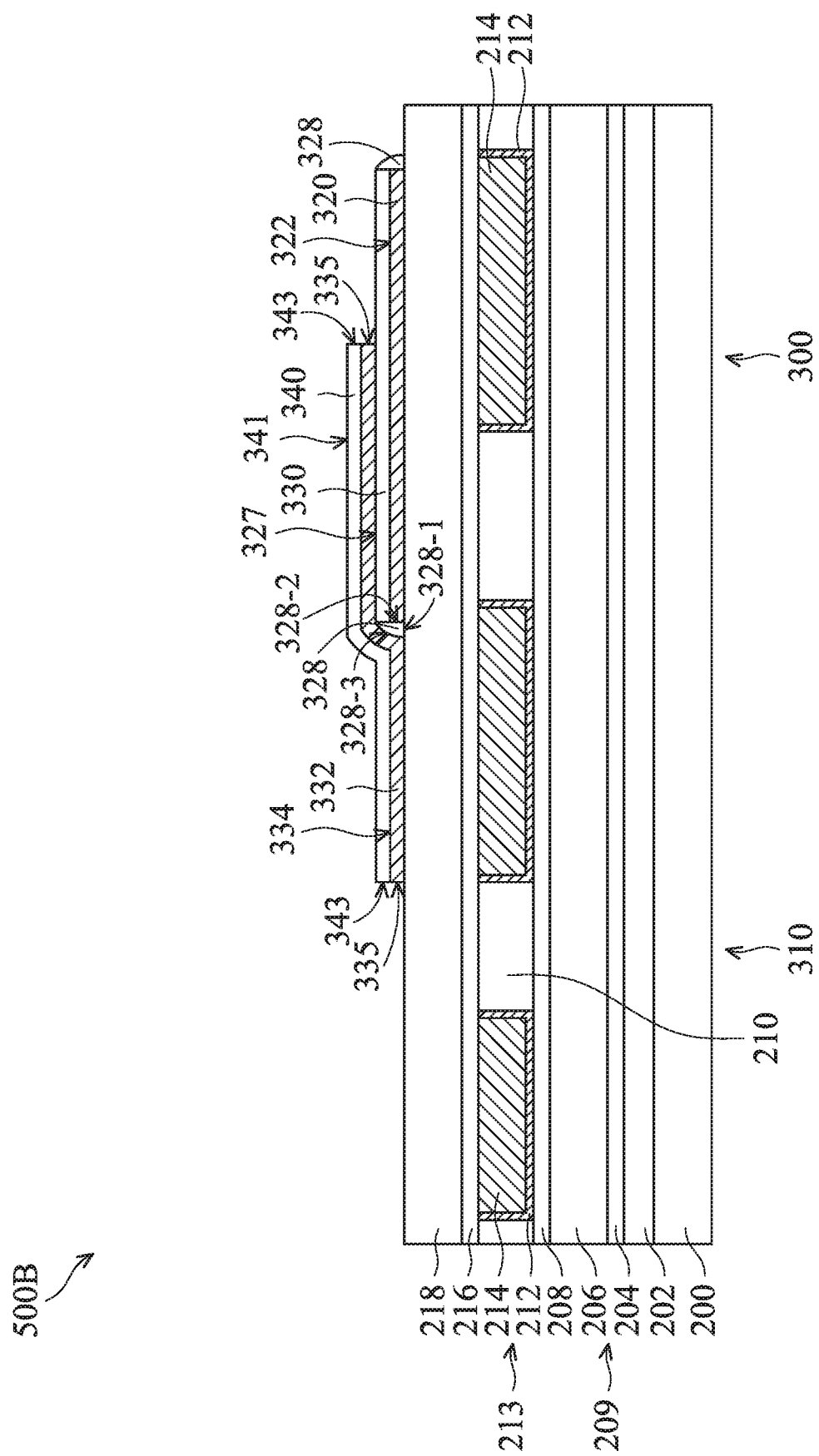

Afterwards, the middle electrode layer 331 and the dielectric layer 339 in the non-capacitor region 310 are removed by a single patterning process to form a middle electrode layer 332 and a dielectric layer 340, as shown in FIG. 2E in accordance with some embodiments. The position and/or processes of the middle electrode layer 332 may be similar to, or the same as, those of the middle electrode layer 232, and the details thereof are not repeated herein. In some embodiments, opposite sidewalls 343 of the dielectric layer 340 are respectively aligned with corresponding opposite sidewalls 335 of the middle electrode layer 332. The dielectric layer 340 is formed covering the capacitor region 300 without extending to cover the non-capacitor region 310 of the substrate 200. In addition, the dielectric layer 340 may partially overlap the dielectric layer 330.

In some embodiments, the dielectric layer 218 is in contact with a surface 328-1 of each of the dielectric spacers 328. The bottom electrode layer 320 and the dielectric layer 330 are both in contact with a surface 328-2 of each of the dielectric spacers 328. The middle electrode layer 332 is in contact with a surface 328-3 of the left dielectric spacer 328.

Figure 2F:
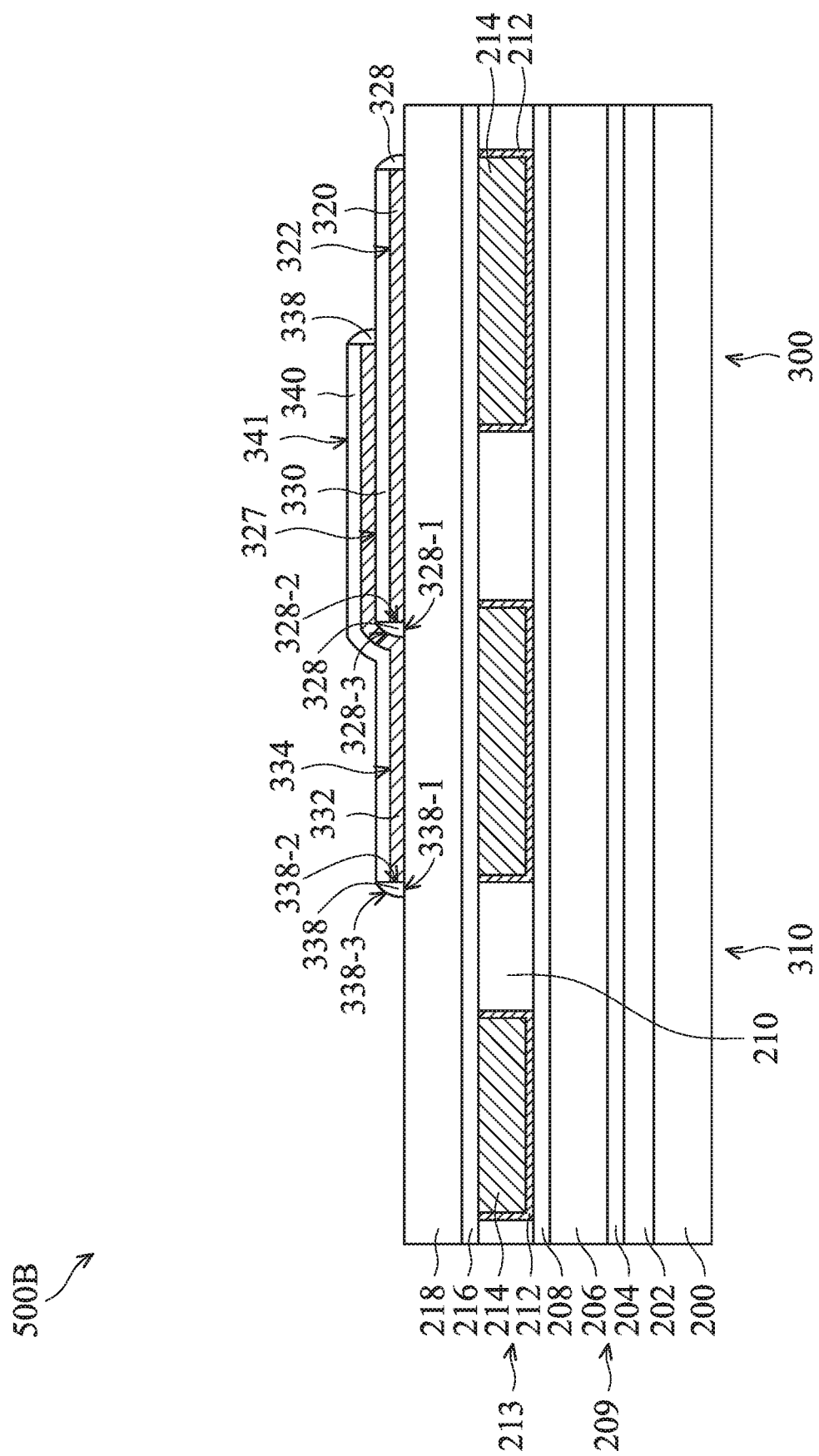

Afterwards, dielectric spacers 338 are formed on the opposite sidewalls 335 of the middle electrode layer 332 and the opposite sidewalls 343 of the dielectric layer 340, as shown in FIG. 2F in accordance with some embodiments.

The dielectric spacers 338 are formed by a deposition process and a subsequent etching process. The deposition process is performed to deposit a dielectric spacer layer (not shown) over a top surface 334 and the opposite sidewalls 335 of the middle electrode layer 332 and a top surface 341 and the opposite sidewalls 343 of the dielectric layer 340.

The etching process is performed to remove a portion of the dielectric spacer layer over the top surface 334 of the middle electrode layer 332 and the top surface 341 of the dielectric layer 340.

Figure 2G:
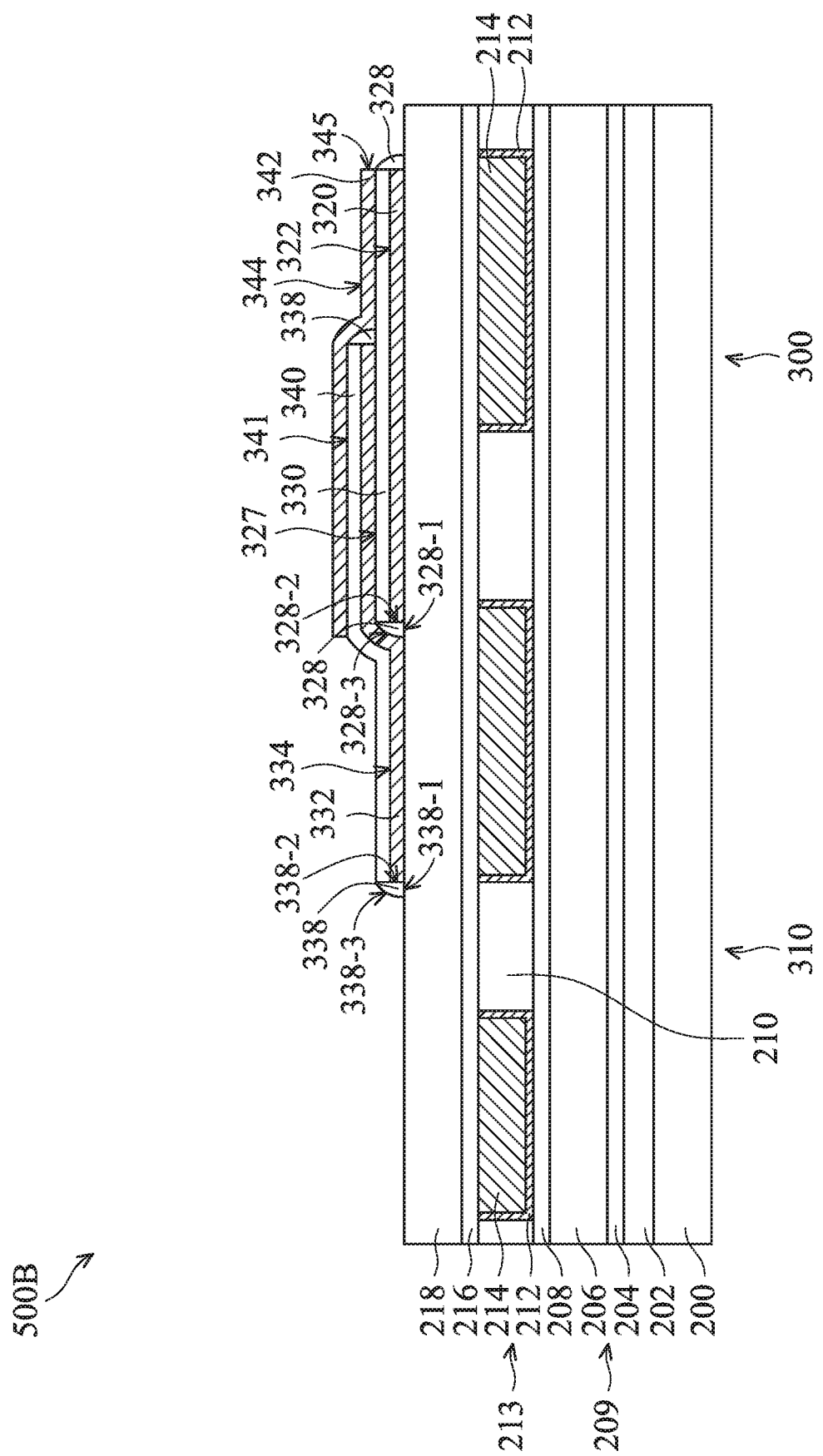

Afterwards, a top electrode layer 342 is formed over the dielectric layer 340, as shown in FIG. 2G in accordance with some embodiments. The position, materials, configurations, structures and/or processes of the top electrode layer 342 may be similar to, or the same as, those of the top electrode layer 242, and the details thereof are not repeated herein.

Figure 2H:
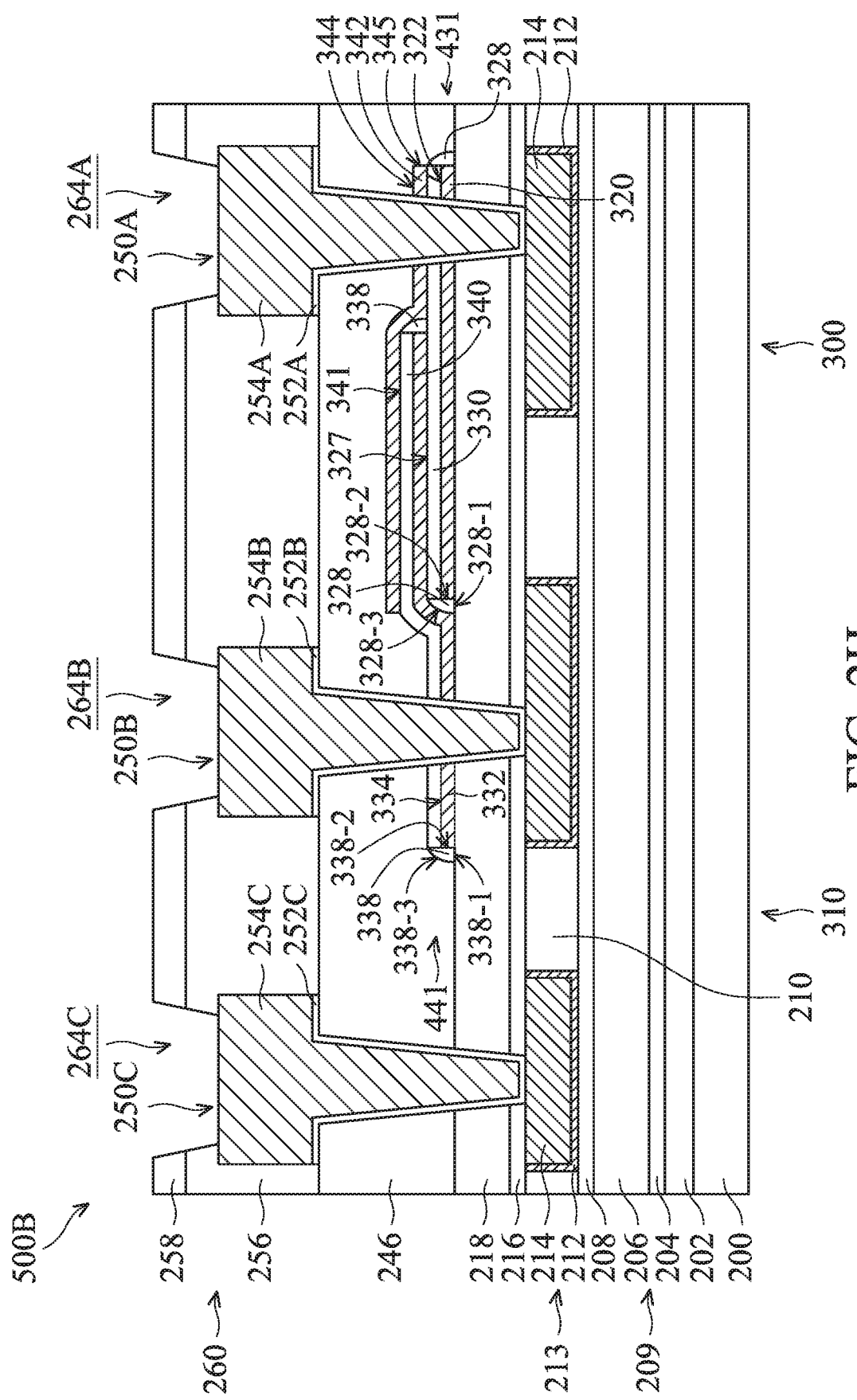

Afterwards, the dielectric layer 246 is formed covering the bottom electrode layer 320, the middle electrode layer 332, the top electrode layer 342, the dielectric layer 230 the dielectric layer 340, the dielectric spacers 328 and the dielectric spacers 338, as shown in FIG. 2H in accordance with some embodiments.

In some embodiments, the dielectric layer 218 is in contact with a surface 338-1 of the left dielectric spacer 338. Therefore, the bottom (i.e. the surface 338-1) of the left dielectric spacer 338 is aligned with the bottoms (i.e. the surfaces 328-1) of the dielectric spacers 328. The top surface 327 of the dielectric layer 330 may be in contact with the surface 338-1 of the right dielectric spacer 338. The middle electrode layer 332 and the dielectric layer 340 may both be in contact with a surface 338-2 of each of the dielectric spacers 338. In addition, the dielectric layer 246 is in contact with a surface 338-3 of the left dielectric spacer 338. The top electrode layer 342 may be in contact with the surface 338-3 of the right dielectric spacer 338.

Afterwards, the RDL structures 250A, 250B and 250C are formed through the dielectric layers 218 and 246 to electrically connect to the top metal lines 213. It should be noted that the RDL structure 250C is formed without passing through the dielectric layers 330 and 340. Afterwards, the passivation layer structure 260 is formed over the RDL structures 250A, 250B and 250C. After the aforementioned processes are performed, a metal-insulator-metal (MIM) capacitor structure 500B is formed, as shown in FIG. 2H in accordance with some embodiments.

In the MIM capacitor structure 500B, the dielectric spacer 328 and the dielectric layer 330 adjacent to the dielectric spacer 328 may collectively serve as a dielectric composite structure 431 between the bottom electrode layer 320 and the middle electrode layer 332. The dielectric layer 330 may serve as a first portion of the dielectric composite structure 431 having a first dielectric constant. Each of the dielectric spacer 328 may serve as a second portion of the dielectric composite structure 431 having a second dielectric constant that is lower than the first dielectric constant.

Some of the advantages of the MIM capacitor structure 500B may be similar to the advantages of the MIM capacitor structure 500A. In addition, the bottom/middle electrode layer and the corresponding high-k dielectric layer of the MIM capacitor structure 500B are patterned using a single patterning process. The dielectric spacers are formed on the sidewalls of the bottom/middle electrode layer and the corresponding high-k dielectric layer. The high-k dielectric layer does not wrap the (sharp) corner between the top surface and the sidewall of the underlying bottom/middle electrode layer. Therefore, the problems with the MIM capacitor structure's reliability resulting from the charge that accumulates in the corner of the bottom/middle electrode layer can be avoided. Therefore, the MIM capacitor structure may have high capacitance value by thinning down the high-k dielectric layer without lowering the breakdown voltage of the MIM capacitor structure. The leakage problem of the MIM capacitor structure can also be eliminated.

Embodiments of a metal-insulator-metal (MIM) capacitor structure (e.g. the MIM capacitor structures 500A and 500B) and a method for forming the MIM capacitor structure are provided. The MIM capacitor structure includes a substrate 200, a bottom electrode layer (e.g. the bottom electrode layers 220 and 320), a first dielectric layer (e.g. the dielectric layers 230 and 330), a top electrode layer (e.g. the top electrode layers 242 and 342) and first dielectric spacers (e.g. the dielectric spacers 228 and 328). The bottom electrode layer is positioned over the substrate. The first dielectric layer is positioned over the bottom electrode layer. The top electrode layer is positioned over the first dielectric layer. The first dielectric spacers are positioned on opposite sidewalls of the bottom electrode layer. The first dielectric layer has a first dielectric constant. The first dielectric spacers have a second dielectric constant that is lower than the first dielectric constant. The MIM capacitor structure may have a high capacitance value by thinning down the high-k dielectric layer without lowering the breakdown voltage of the MIM capacitor structure.

Embodiments of a metal-insulator-metal (MIM) capacitor structure and a method for forming the MIM capacitor structure are provided. The MIM capacitor structure includes a substrate, a bottom electrode layer, a first dielectric layer, a top electrode layer and first dielectric spacers. The bottom electrode layer is positioned over the substrate. The first dielectric layer is positioned over the bottom electrode layer. The top electrode layer is positioned over the first dielectric layer. The first dielectric spacers are positioned on opposite sidewalls of the bottom electrode layer. The first dielectric layer has a first dielectric constant. The first dielectric spacers have a second dielectric constant that is lower than the first dielectric constant. The MIM capacitor structure may have high capacitance value by thinning down the high-k dielectric layer without lowering the breakdown voltage of the MIM capacitor structure.

In some embodiments, a MIM capacitor structure is provided. The MIM capacitor structure includes a substrate, and the substrate includes a capacitor region and a non-capacitor region. The MIM capacitor structure includes a first electrode layer formed over the substrate, and a first spacer formed on a sidewall of the first electrode layer. The MIM capacitor structure includes a first dielectric layer formed on the first spacers, and a second electrode layer formed on the first dielectric layer. The second electrode layer extends from the capacitor region to the non-capacitor region, and the second electrode layer extends beyond an outer sidewall of the first spacer.

In some embodiments, a MIM capacitor structure is provided. The MIM capacitor structure includes a first electrode layer formed over a substrate, and a first dielectric layer formed on the first electrode layer. The MIM capacitor structure includes a first spacer formed on a sidewall of the first electrode layer and a sidewall of the first electric layer, and a second electrode layer formed on the first spacer and the first dielectric layer, wherein the first spacer is in direct contact with the second electrode layer.

In some embodiments, a method for forming a MIM capacitor structure is provided. The method includes forming a first electrode layer over a substrate, and forming a first dielectric layer on the first electrode layer. The method also includes forming a first spacer on a sidewall of the first electrode layer and a sidewall of the first dielectric layer and forming a second electrode layer on the first dielectric layer and the first spacer. The first spacer is in direct contact with the second electrode layer.

In some embodiments, a MIM capacitor structure is provided. The MIM capacitor structure includes a substrate, and the substrate includes a capacitor region and a non-capacitor region. The MIM capacitor structure includes a first electrode layer formed over the substrate, and a first spacer formed on a sidewall of the first electrode layer. The MIM capacitor structure includes a second electrode layer formed over the first electrode layer, and a second spacer formed on a sidewall of the second electrode layer. The second spacer is in direct contact with an interface between the second electrode layer and a first dielectric layer.

In some embodiments, a MIM capacitor structure is provided. The MIM capacitor structure includes a first electrode layer formed over a substrate, and a first dielectric layer formed on the first electrode layer. The MIM capacitor structure includes a first spacer formed on a sidewall of the first electrode layer and a sidewall of the first dielectric layer, and a second electrode layer formed on the first spacer and the first dielectric layer. The MIM capacitor structure includes a second spacer formed on a sidewall of the second electrode layer, and a bottom surface of the second spacer layer is leveled with a top surface of the first spacer.

In some embodiments, a MIM capacitor structure is provided. The MIM capacitor structure includes a first electrode layer formed over a substrate, and a first dielectric layer formed on and in direct contact with the first electrode layer. The first dielectric layer has a top portion and a bottom portion lower than the top portion. The MIM capacitor structure includes a first spacer formed on a sidewall of the first electrode layer and a sidewall of the first dielectric layer, and a first via through the bottom portion of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor structure, comprising:
    a substrate, wherein the substrate comprises a capacitor region and a non-capacitor region;
    a first electrode layer formed over the substrate;
    a first spacer formed on a sidewall of the first electrode layer;
    a second electrode layer formed over the first electrode layer; and
    a second spacer formed on a sidewall of the second electrode layer, wherein the second spacer is in direct contact with an interface between the second electrode layer and a first dielectric layer, wherein the second spacer has a tapered width from bottom to top.

2. The MIM capacitor structure as claimed in claim 1, further comprises:
    a second dielectric layer between the first electrode layer and the second electrode layer, wherein the second dielectric layer extends from the capacitor region to the non-capacitor region.

3. The MIM capacitor structure as claimed in claim 2, wherein the second dielectric layer has a first dielectric constant, and the first spacer has a second dielectric constant that is lower than the first dielectric constant.

4. The MIM capacitor structure as claimed in claim 1, further comprising:
    a redistribution layer (RDL) structure formed over the second electrode layer, wherein the RDL structure passes through the second electrode layer.

5. The MIM capacitor structure as claimed in claim 1, further comprising:
    a third electrode layer formed on the first dielectric layer, wherein the second spacer is between the second electrode layer and the third electrode layer.

6. The MIM capacitor structure as claimed in claim 1, wherein the second electrode layer comprise a top portion and a bottom portion, a bottom surface of the bottom portion is leveled with a bottom surface of the first spacer.

7. The MIM capacitor structure as claimed in claim 1, wherein a portion of the second electrode layer has a bottom surface which is leveled with a bottom surface of the first electrode layer.

8. The MIM capacitor structure as claimed in claim 1, wherein the first spacer is in direct contact with the second electrode layer.

9. The MIM capacitor structure as claimed in claim 1, further comprising:
    a third spacer formed on another sidewall of the second electrode layer, wherein a top surface of the second spacer is higher than a top surface of the third spacer.

10. The MIM capacitor structure as claimed in claim 1, wherein a bottom surface of the second spacer is in direct contact with the a second dielectric layer.

11. A metal-insulator-metal (MIM) capacitor structure, comprising:
    a first electrode layer formed over a substrate;
    a first dielectric layer formed on the first electrode layer;
    a first spacer formed on a sidewall of the first electrode layer and a sidewall of the first dielectric layer;
    a second electrode layer formed on the first spacer and the first dielectric layer; and
    a second spacer formed on a sidewall of the second electrode layer, wherein a bottom surface of the second spacer layer is leveled with a top surface of the first spacer.

12. The MIM capacitor structure as claimed in claim 11, wherein the substrate comprises a capacitor region and a non-capacitor region, and the first dielectric layer extends from the capacitor region to the non-capacitor region.

13. The MIM capacitor structure as claimed in claim 11, wherein the first spacer has a height which is a sum of a height of the first electrode layer and a height of the first dielectric layer.

14. The MIM capacitor structure as claimed in claim 11, wherein the second electrode layer comprise a top portion and a bottom portion, a bottom surface of the bottom portion is leveled with a bottom surface of the first spacer.

15. The MIM capacitor structure as claimed in claim 11, further comprising:
    a second dielectric layer formed on the second spacer; and
    a third electrode layer formed on the second dielectric layer, wherein the second spacer is between the second electrode layer and the third electrode layer.

16. The MIM capacitor structure as claimed in claim 11, wherein the first spacer has a tapered width from a bottom surface to a top surface.

17. A metal-insulator-metal (MIM) capacitor structure, comprising:
- a first electrode layer formed over a substrate;
- a first dielectric layer formed on and in direct contact with the first electrode layer, wherein the first dielectric layer has a top portion and a bottom portion lower than the top portion;
- a first spacer formed on a sidewall of the first electrode layer and a sidewall of the first dielectric layer;
- a first via through the bottom portion of the first dielectric layer;
- a second electrode layer formed on the first spacer and the first dielectric layer; and
- a second spacer layer formed on a sidewall of the second electrode layer.

18. The MIM capacitor structure as claimed in claim 17, wherein the second electrode layer is through the first via.

19. The MIM capacitor structure as claimed in claim 17, further comprising:
- a second dielectric layer over the second electrode layer, wherein the second dielectric layer is through the first via.

20. The MIM capacitor structure as claimed in claim 17, further comprising:
- a second via, wherein the first electrode layer and the first dielectric layer are through the second via.

* * * * *